US012614599B2

(12) United States Patent
Chen et al.

(10) Patent No.: US 12,614,599 B2
(45) Date of Patent: Apr. 28, 2026

(54) EMBEDDED ELECTRONIC FUSES

(71) Applicant: QUALCOMM Incorporated, San Diego, CA (US)

(72) Inventors: Minghui Chen, San Diego, CA (US); Yiwu Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 128 days.

(21) Appl. No.: 18/596,246

(22) Filed: Mar. 5, 2024

(65) Prior Publication Data

US 2025/0285693 A1 Sep. 11, 2025

(51) Int. Cl.
*G11C 17/18* (2006.01)

(52) U.S. Cl.
CPC ..................................... *G11C 17/18* (2013.01)

(58) Field of Classification Search
CPC ...................................................... G11C 17/18
USPC ............................................................. 365/96
See application file for complete search history.

(56) References Cited

U.S. PATENT DOCUMENTS

| | | | | |
|---|---|---|---|---|
| 7,304,527 | B1 * | 12/2007 | Guzman | H03K 17/18 |
| | | | | 257/E23.149 |
| 9,792,962 | B1 * | 10/2017 | La Rosa | G11C 7/08 |
| 11,164,610 | B1 * | 11/2021 | Kota | G11C 29/027 |
| 2021/0295934 | A1 * | 9/2021 | Dozaka | H03K 19/20 |

OTHER PUBLICATIONS

International Search Report and Written Opinion—PCT/US2025/011780—ISA/EPO—Mar. 17, 2025.

* cited by examiner

*Primary Examiner* — Muna A Techane
(74) *Attorney, Agent, or Firm* — Loza & Loza, LLP

(57) ABSTRACT

A system includes a read amplifier having a first input, a second input, a first output, and a second output. The read amplifier includes a first inverter having an input and an output, wherein the output of the first inverter is coupled to the first output of the read amplifier, and a second inverter having an input and an output, wherein the output of the second inverter is coupled to the second output of the read amplifier and the input of the first inverter, and the input of the second inverter is coupled to the output of the first inverter. The system also includes one or more first fuses coupled to the first input of the read amplifier, and one or more second fuses coupled to the second input of the read amplifier.

17 Claims, 12 Drawing Sheets

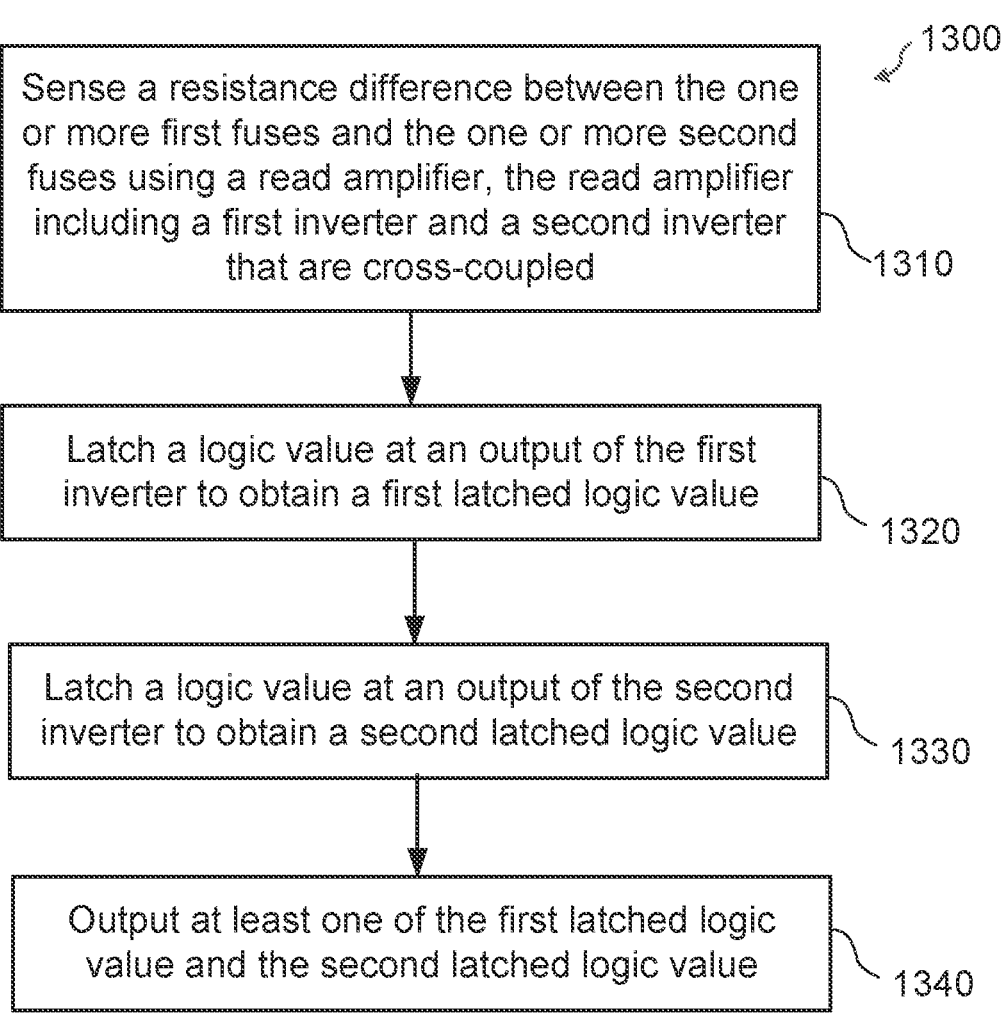

1300

Sense a resistance difference between the one or more first fuses and the one or more second fuses using a read amplifier, the read amplifier including a first inverter and a second inverter that are cross-coupled

1310

Latch a logic value at an output of the first inverter to obtain a first latched logic value

1320

Latch a logic value at an output of the second inverter to obtain a second latched logic value

1330

Output at least one of the first latched logic value and the second latched logic value

EMBEDDED ELECTRONIC FUSES

BACKGROUND

Field

Aspects of the present disclosure relate generally to non-volatile memory, and, more particularly, to embedded electronic fuses.

Background

An electronic device may include non-volatile memory (e.g., for storing device settings and/or other information). The non-volatile memory may include electronic fuses (also referred to as E-fuse or eFuse) where each fuse may store a bit value of one or zero depending on whether the electronic fuse is blown or unblown.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a read amplifier having a first input, a second input, a first output, and a second output. The read amplifier includes a first inverter having an input and an output, wherein the output of the first inverter is coupled to the first output of the read amplifier, and a second inverter having an input and an output, wherein the output of the second inverter is coupled to the second output of the read amplifier and the input of the first inverter, and the input of the second inverter is coupled to the output of the first inverter. The system also includes one or more first fuses coupled to the first input of the read amplifier, and one or more second fuses coupled to the second input of the read amplifier.

A second aspect relates to a method for reading a bit stored in electronic fuses. The electronic fuses include one or more first fuses and one or more second fuses. The method includes sensing a resistance difference between the one or more first fuses and the one or more second fuses using a read amplifier, the read amplifier including a first inverter and a second inverter that are cross coupled, latching a logic value at an output of the first inverter to obtain a first latched logic value, latching a logic value at an output of the second inverter to obtain a second latched logic value, wherein the first latched logic value and the second latched logic value are complementary, and outputting at least one of the first latched logic value and the second latched logic value.

BRIEF DESCRIPTION OF THE DRAWINGS

FIG. 13 is a flowchart illustrating an exemplary method for reading a bit stored in electronic fuses according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
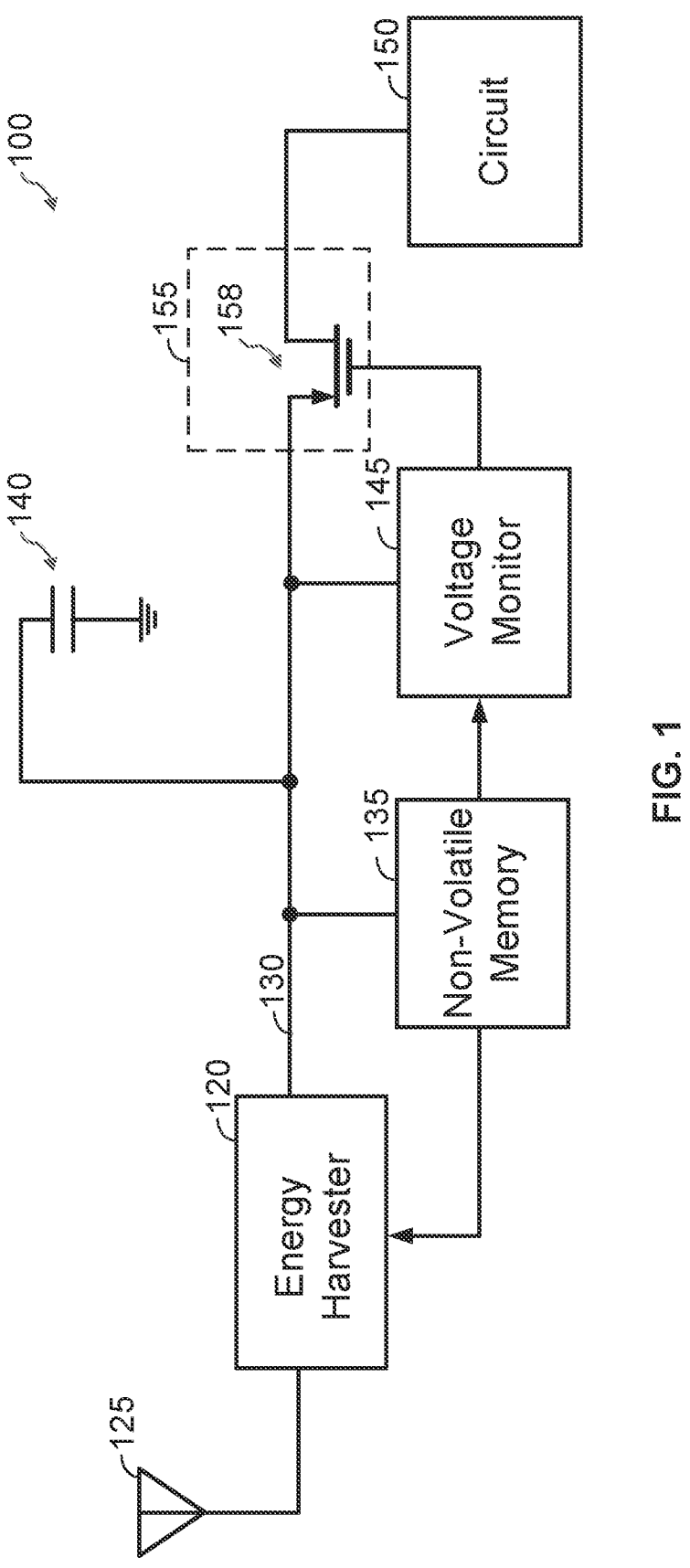
FIG. 1 shows an example of a device including an energy harvester and a non-volatile memory according to certain aspects of the present disclosure.

FIG. 1 shows an example of an electronic device 100 according to certain aspects. The device 100 may include an Internet of Things (IoT) device, a sensor device, an asset tracker, a security device, a smart appliance, a wearable device, a communication device, a monitor, and so forth.

In the example in FIG. 1, the device 100 includes an energy harvester 120 configured to convert ambient energy (i.e., energy from the surrounding environment) into electrical energy to power the device 100. For example, the device 100 may be a battery-less device that relies on the energy harvester 120 for power. However, it is to be appreciated that the device 100 is not limited to a battery-less device and that the device 100 may also include a battery (not shown) in some implementations.

The energy harvester 120 may be implemented with any one of various types of energy harvesters. For example, the energy harvester 120 may be implemented with a radio receiver configured to convert radio frequency (RF) energy received by an antenna 125 into electrical energy. In another example, the energy harvester 120 may be implemented with a solar cell configured to convert solar energy into electrical energy. In still another example, the energy harvester 120 may be implemented with a piezoelectric transducer configured to convert vibrations or other types of mechanical energy into electrical energy. In yet another example, the
energy harvester 120 may be implemented with a thermo-
electric energy harvester configured to convert heat into
electrical energy. In some implementations, the energy har-
vester 120 may include a combination of two or more
different types of energy harvesters (e.g., a combination of
two or more of the exemplary energy harvesters discussed
above).

The device 100 also includes a non-volatile memory 135,
a storage capacitor 140, a voltage monitor 145, a power
switch 155, and a circuit 150. Depending on the type of
device, the circuit 150 may include one or more sensors
(e.g., a temperature sensor, a humidity sensor, a biosensor, a
gas sensor, a chemical sensor, a motion sensor, a proximity
sensor, etc.), a wireless transmitter, and/or another type of
circuit.

In this example, the energy harvester 120 is coupled to the
storage capacitor 140 via a power bus 130 (also referred to
as a supply bus or another type). The energy harvester 120
is configured to output the electrical energy to the power bus
130, and the storage capacitor 140 is configured to store the
electrical energy in the form of electric charge. The electric
charge on the storage capacitor 140 produces a voltage on
the power bus 130 which is used to provide a supply voltage
for the circuit 150, as discussed further below.

In this example, the voltage monitor 145 is coupled to the
power bus 130 and is configured to monitor the voltage on
the power bus 130. The power switch 155 is coupled
between the power bus 130 and the circuit 150. The on/off
state of the power switch 155 is controlled by the voltage
monitor 145, which uses the power switch 155 to selectively
couple the circuit 150 to the power bus 130 based on the
monitored voltage on the power bus 130. For example, the
voltage monitor 145 may compare the monitored voltage on
the power bus 130 with a voltage threshold, turn off the
power switch 155 if the monitored voltage is below the
voltage threshold, and turn on the power switch 155 if the
monitored voltage is equal to or greater than the voltage
threshold. Thus, in this example, the circuit 150 is coupled
to the power bus 130 to receive power when the voltage on
the power bus 130 reaches the voltage threshold.

In the example shown in FIG. 1, the power switch 155
includes a p-type field effect transistor (PFET) 158, in which
the gate of the PFET 158 is coupled to the voltage monitor
145. In this example, the voltage monitor 145 may output the
voltage on the power bus 130 to the gate of the PFET 158
to turn off the power switch 155, and couple the gate of the
PFET 158 to ground potential to turn on the PFET 158.
However, it is to be appreciated that the power switch 155
is not limited to this example, and that the power switch 155
may be implemented with other types of switches.

The non-volatile memory 135 is coupled to the power bus
130 to receive power. The non-volatile memory 135 may be
used to store one or more settings for the voltage monitor
145 and/or the energy harvester 120. For example, the
non-volatile memory 135 may store the voltage threshold for
the voltage monitor 145. In some implementations, the
voltage threshold may be a function of the process corner of
the circuit 150. For example, the voltage threshold may be
higher for a slow-slow (SS) process corner and lower for a
fast-fast (FF) process corner. In this example, the non-
volatile memory 135 may include process information for
the circuit 150. For the example where the energy harvester
120 includes a receiver for harvesting RF energy, the non-
volatile memory may store frequency tuning information for
the receiver.

The non-volatile memory 135 may be implemented with
electronic fuses (also referred to as E-fuse or eFuse), in
which each electronic fuse may store a bit value of one or
zero depending on whether the electronic fuse is blown or
unblown. For example, an electronic fuse may be left
unblown to store a bit value of zero, and blown to store a bit
value of one. The resistance of an unblown fuse may be low
(e.g., less than 20 ohms) and the resistance of a blown fuse
may be high (e.g., on the order of kilohms). Thus, the bit
value stored by an electronic fuse may be read by sensing the
resistance of the fuse.

To read the bit value of an electronic fuse, a read circuit
may pre-charge a sense node high and couple the sense node
to the electronic fuse. If the fuse is blown (i.e., the resistance
of the fuse is high), then the sense node stays high. If the fuse
is unblown (i.e., the resistance of the fuse is low), then the
sense node is discharged through the fuse and goes low. The
read circuit then determines whether the bit value of the fuse
is one or zero based on whether the sense node is high or
low.

The read circuit discussed above may require a supply
voltage of at least 0.8 volts to operate and a clock signal
(e.g., 1 MHz to 10 MHz clock signal) for timing operations
of the read circuit. In addition, the read circuit may consume
a relatively large amount of current to sense whether an
electronic fuse is blown or unblown (e.g., current on the
order of milliamps to sense an unblown fuse).

A challenge with implementing the non-volatile memory
135 using electronic fuses is that the energy harvester 120
provides a small amount of energy, which may not be
sufficient to power the read circuit discussed above. For
example, the energy collected by the energy harvester 120
may be well below the amount of energy needed to generate
the clock signal for the read circuit and provide the relatively
large current consumed by the read circuit for sensing
operations. Further, the voltage on the power bus 130 may
be much lower than the minimum voltage required for the
read circuit to operate.

Figure 2:
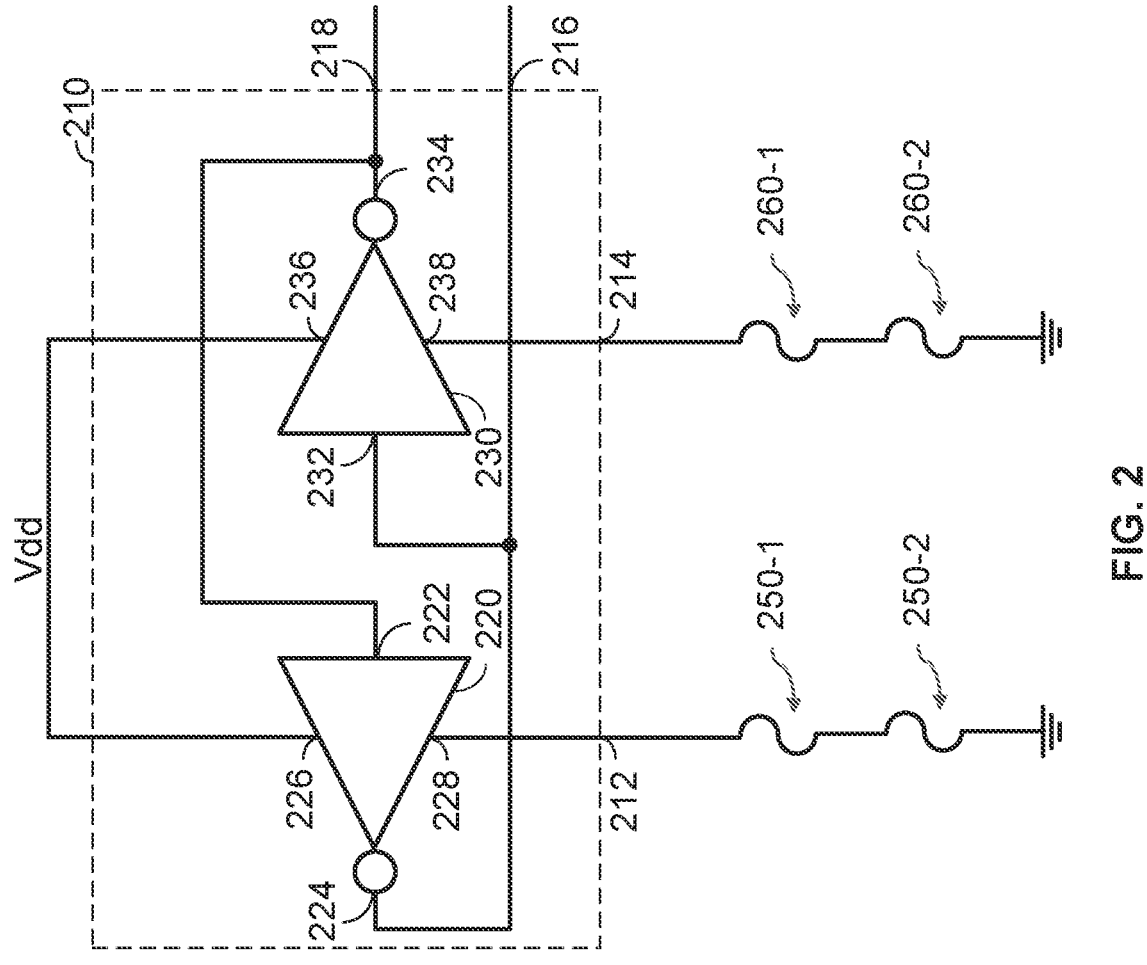
FIG. 2 shows an example of a read amplifier configured to read a bit stored on electronic fuses according to certain aspects of the present disclosure.

FIG. 2 shows an example of a read amplifier 210 accord-
ing to certain aspects of the present disclosure. The read
amplifier 210 uses positive feedback to sense a resistance
difference between one or more blown fuses and one or more
unblown fuses. As discussed further below, this allows the
read amplifier 210 to read a bit using a low voltage and low
current, making the read amplifier 210 suitable for use in a
device (e.g., the device 100) powered by an energy harvester
(e.g., the energy harvester 120).

The read amplifier 210 has a first input 212, a second input
214, a first output 216, and a second output 218. The first
input 212 is coupled to one or more first fuses 250-1 to
250-2, and the second input 214 is coupled to one or more
second fuses 260-1 to 260-2. In the example shown in FIG.
2, the one or more first fuses 250-1 to 250-2 are coupled in
series between the first input 212 of the read amplifier 210
and ground, and the one or more second fuses 260-1 to 260-2
are coupled in series between the second input 214 of the
read amplifier 210 and ground. FIG. 2 shows an example
where the one or more first fuses 250-1 to 250-2 include two
fuses. However, it is to be appreciated that the one or more
first fuses 250-1 to 250-2 may include a single fuse or two
or more fuses (e.g., four fuses, eight fuses, sixteen fuses,
etc.) in other examples. FIG. 2 also shows an example where
the one or more second fuses 260-1 to 260-2 include two
fuses. However, it is to be appreciated that the one or more
second fuses 260-1 to 260-2 may include a single fuse or two
or more fuses (e.g., four fuses, eight fuses, sixteen fuses,
etc.) in other examples.

In this example, the one or more first fuses 250-1 to 250-2 and the one or more second fuses 260-1 to 260-2 are used to store a bit value. For example, to store a bit value of zero, the one or more first fuses 250-1 to 250-2 may be unblown and the one or more second fuses 260-1 to 260-2 may be blown. To store a bit value of one, the one or more first fuses 250-1 to 250-2 may be blown and the one or more second fuses 260-1 to 260-2 may be unblown. Exemplary circuitry for blowing the one or more first fuses 250-1 to 250-2 or the one or more second fuses 260-1 to 260-2 is discussed below with reference to FIG. 4.

Thus, when a bit value of zero or one is stored, one of the inputs 212 and 214 of the read amplifier 210 is coupled to one or more blown fuses and the other one of the inputs 212 and 214 of the read amplifier 210 is coupled to one or more unblown fuses. This creates a large resistance difference between the inputs 212 and 214 of the read amplifier 210 in which the resistance of the input coupled to the one or more blown fuses is much higher than the resistance of the input coupled to the one or more unblown fuses. The resistance difference between the inputs 212 and 214 of the read amplifier 210 may be increased by increasing the number of the one or more first fuses 250-1 and 250-2 and increasing the number of the one or more second fuses 260-1 and 260-2. As discussed further below, the read amplifier 210 reads the stored bit value by sensing the resistance difference between the inputs 212 and 214.

In this example, the read amplifier 210 includes a first inverter 220 and a second inverter 230 that are cross coupled to provide positive feedback. As used herein, first and second inverters are cross coupled when the input of the first inverter is coupled to the output of the second inverter, and the input of the second inverter is coupled to the output of the first inverter. In this regard, the input 222 of the first inverter 220 is coupled to the output 234 of the second inverter 230, and the input 232 of the second inverter 230 is coupled to the output 224 of the first inverter 220. In this example, the output 224 of the first inverter 220 is coupled to the first output 216 of the read amplifier 210, and the output 234 of the second inverter 230 is coupled to the second output 218 of the read amplifier 210.

The first inverter 220 has a first terminal 226 coupled to a supply rail Vdd and a second terminal 228 coupled to the first input 212 of the read amplifier 210. The first terminal 226 may also be referred to as a supply terminal or a power terminal. The first inverter 220 may be configured to pull the output 224 of the first inverter 220 to the potential at the first terminal 226 (e.g., Vdd) when the first inverter 220 is driven high and pull the output 224 of the first inverter 220 to the potential at the second terminal 228 when the first inverter 220 is driven low.

The second inverter 230 has a first terminal 236 coupled to the supply rail Vdd and a second terminal 238 coupled to the second input 214 of the read amplifier 210. The second inverter 230 may be configured to pull the output 234 of the second inverter 230 to the potential at the first terminal 236 (e.g., Vdd) when the second inverter 230 is driven high and pull the output 234 of the second inverter 230 to the potential at the second terminal 238 when the second inverter 230 is driven low.

During operation, the positive feedback of the cross-coupled inverters 220 and 230 causes the read amplifier 210 to go into a first state or a second state based on the resistance difference at the inputs 212 and 214. In the first state, the first output 216 is low (i.e., zero) and the second output 218 is high (i.e., one). In the second state, the first output 216 is high (i.e., one) and the second output 218 is low (i.e., zero). In this example, the first state may indicate a read bit value of zero, and the second state may indicate a read bit value of one, or vice versa.

When the one or more first fuses 250-1 to 250-2 are unblown and the one or more second fuses 260-1 to 260-2 are blown (e.g., stored bit value of zero), the resistance at the first input 212 of the read amplifier 210 is much lower than the resistance at the second input 214 of the read amplifier 210. This resistance difference causes the positive feedback of the cross-coupled inverters 220 and 230 to push the read amplifier 210 into the first state in which the first output 216 is low (i.e., zero) and the second output 218 is high (i.e., one) indicating a read bit value of zero.

When the one or more first fuses 250-1 to 250-2 are blown and the one or more second fuses 260-1 to 260-2 are unblown (e.g., stored bit value of one), the resistance at the first input 212 of the read amplifier 210 is much higher than the resistance at the second input 214 of the read amplifier 210. This resistance difference causes the positive feedback of the cross-coupled inverters 220 and 230 to push the read amplifier 210 into the second state in which the first output 216 is high (i.e., one) and the second output 218 is low (i.e., zero) indicating a read bit value of one.

In this example, the positive feedback of the cross-coupled inverters 220 and 230 allows the read amplifier 210 to sense the resistance difference between the inputs 212 and 214 of the read amplifier 210 (and hence read the stored bit value) using a low voltage and low current. This is because the positive feedback is able to push the read amplifier 210 into one of the first and second states indicating the read bit value based on the resistance difference using a low voltage and low current. As discussed above, the resistance difference between the inputs 212 and 214 of the read amplifier 210 is generated by blowing the one or more fuses on one side of the read amplifier 210 and leaving the one or more fuses on the other side of the read amplifier 210 unblown.

Figure 3:
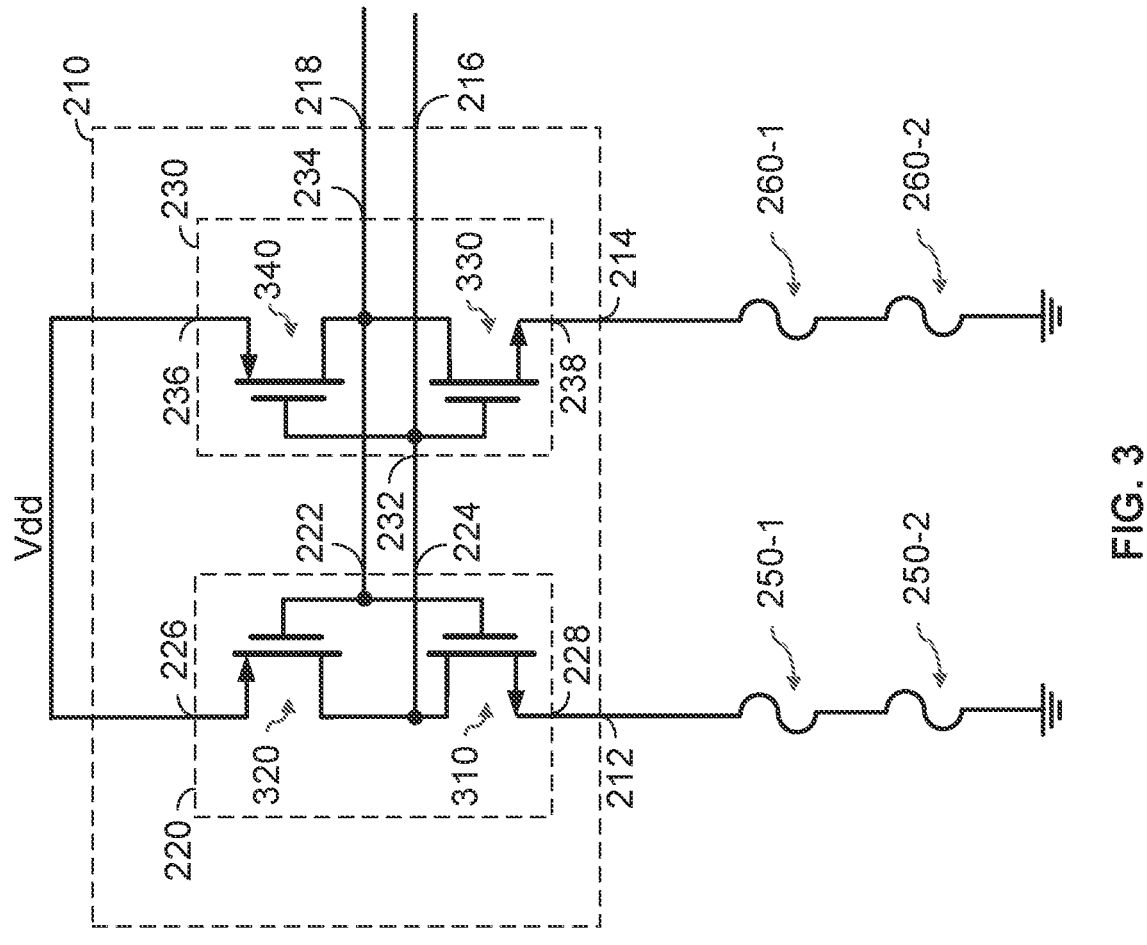
FIG. 3 shows an exemplary implementation of inverters in the read amplifier of FIG. 2 according to certain aspects of the present disclosure.

FIG. 3 shows an example in which each of the first inverter 220 and the second inverter 230 is implemented with a complementary inverter.

In this example, the first inverter 220 includes a first n-type field effect transistor (NFET) 310 and a first p-type field effect transistor (PFET) 320. The drain of the first NFET 310 is coupled to the output 224, the gate of the first NFET 310 is coupled to the input 222, and the source of the first NFET 310 is coupled to the second terminal 228. The drain of the first PFET 320 is coupled to the output 224, the gate of the first PFET 320 is coupled to the input 222, and the source of the first PFET 320 is coupled to the first terminal 226. However, it is to be appreciated that the first inverter 220 is not limited to the exemplary implementation shown in FIG. 3.

The second inverter 230 includes a second NFET 330 and a second PFET 340. The drain of the second NFET 330 is coupled to the output 234, the gate of the second NFET 330 is coupled to the input 232, and the source of the second NFET 330 is coupled to the second terminal 238. The drain of the second PFET 340 is coupled to the output 234, the gate of the second PFET 340 is coupled to the input 232, and the source of the second PFET 340 is coupled to the first terminal 236. However, it is to be appreciated that the second inverter 230 is not limited to the exemplary implementation shown in FIG. 3.

Figure 4:
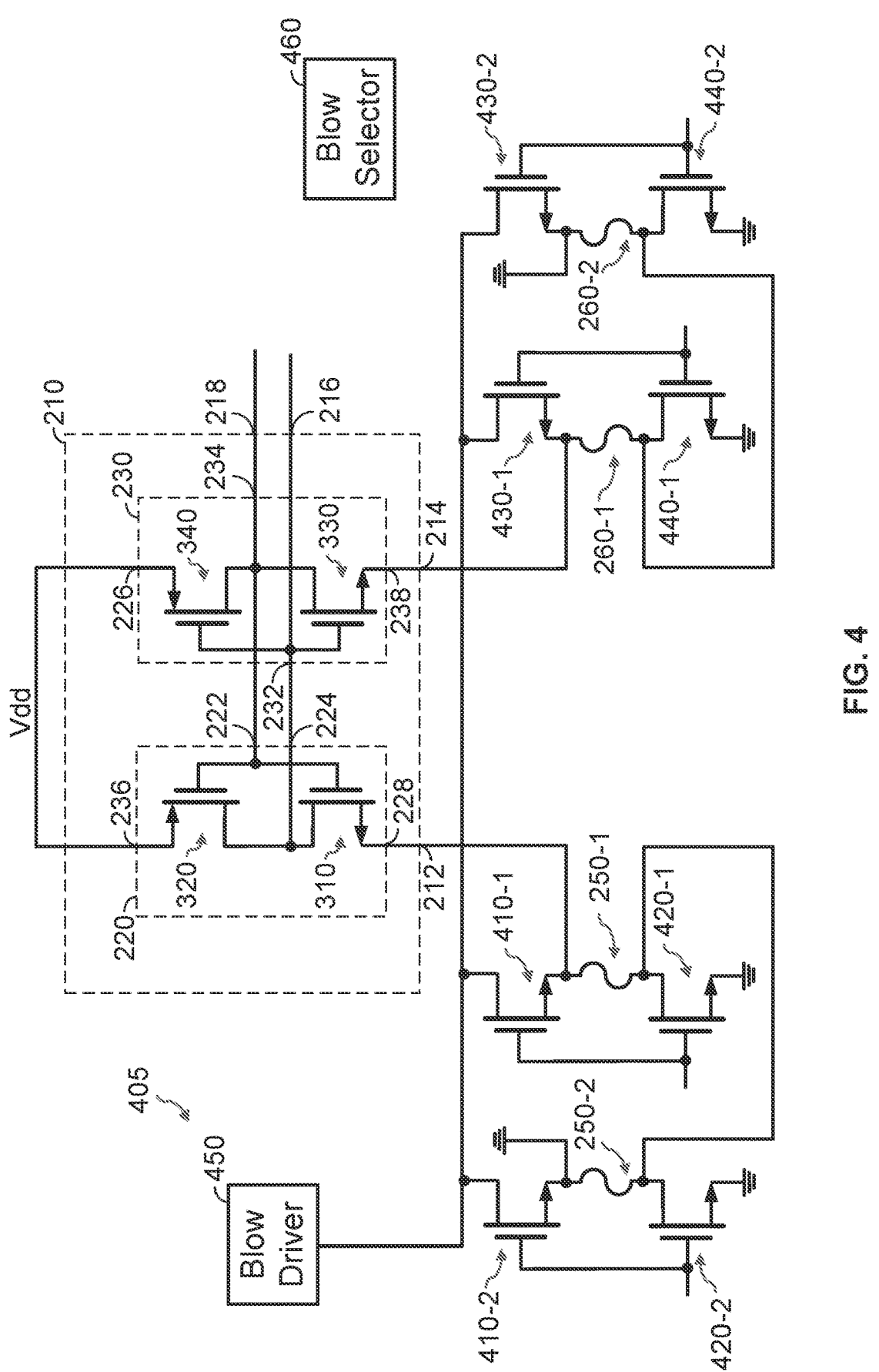
FIG. 4 shows an example of a write circuit configured to write a bit value according to certain aspects of the present disclosure.

FIG. 4 shows an example of a write circuit 405 for programming the one or more first fuses 250-1 and 250-2 and the one or more second fuses 260-1 and 260-2 with a bit value. The write circuit 405 includes a blow driver 450 configured to blow one or more fuses by driving high current through the one or more fuses, as discussed further below. The write circuit 405 also includes a blow selector 460 configured to select the one or more first fuses 250-1 and 250-2 or the one or more second fuses 260-1 and 260-2 for a blow operation by the blow driver 450 depending on the bit value being stored.

The write circuit 405 also includes transistors 410-1 and 410-2 and transistors 420-1 and 420-2 for selectively blowing the one or more first fuses 250-1 and 250-2. Each of the transistors 410-1 and 410-2 is coupled between the blow driver 450 and a respective one of the one or more first fuses 250-1 and 250-2, and each of the transistors 420-1 and 420-2 is coupled between a respective one of the one or more first fuses 250-1 and 250-2 and ground. The gates of the transistors 410-1, 410-2, 420-1, and 420-2 are coupled to the blow selector 460, which controls the on/off states of the transistors 410-1, 410-2, 420-1, and 420-2. For ease of illustration, the individual connections between the gates of the transistors 410-1, 410-2, 420-1, and 420-2 and the blow selector 460 are not shown in FIG. 4.

The write circuit 405 also includes transistors 430-1 and 430-2 and transistors 440-1 and 440-2 for selectively blowing the one or more second fuses 260-1 and 260-2. Each of the transistors 430-1 and 430-2 is coupled between the blow driver 450 and a respective one of the one or more second fuses 260-1 and 260-2, and each of the transistors 440-1 and 440-2 is coupled between a respective one of the one or more second fuses 260-1 and 260-2 and ground. The gates of the transistors 430-1, 430-2, 440-1, and 440-2 are coupled to the blow selector 460, which controls the on/off states of the transistors 430-1, 430-2, 440-1, and 440-2. For ease of illustration, the individual connections between the gates of the transistors 430-1, 430-2, 440-1, and 440-2 and the blow selector 460 are not shown in FIG. 4.

In certain aspects, the write circuit 405 is used to program the one or more first fuses 250-1 and 250-2 and the one or more second fuses 260-1 and 260-2 one time at a factory or another facility. In these aspects, the blow driver 450 may be temporarily coupled to an external power source (not shown) at the factory or the other facility to provide the blow driver 450 with power to perform a blow operation. This way, the blow driver 450 is not constrained by the limited power that can be delivered by the energy harvester 120. After the blow operation, the external power source may be removed. In some implementations, the blow driver 450 may also be external to the device 100. In these implementations, the blow driver 450 may be temporarily coupled to the device 100 at the factor or the other facility to perform the blow operation.

To store a bit value of one, the blow selector 460 selects the one or more first fuses 250-1 and 250-2 by turning on the transistors 410-1, 410-2, 420-1, and 420-2 for the one or more first fuses 250-1 and 250-2 while leaving the transistors 430-1, 430-2, 440-1, and 440-2 for the one or more second fuses 260-1 and 260-2 turned off. The blow driver 450 then drives a high current through the one or more first fuses 250-1 and 250-2. The high current electro-migrates the metal in each of the one or more first fuses 250-1 and 250-2, which blows the one or more first fuses 250-1 and 250-2 and significantly increases the resistances of the one or more first fuses 250-1 and 250-2.

To store a bit value of zero, the blow selector 460 selects the one or more second fuses 260-1 and 260-2 by turning on the transistors 430-1, 430-2, 440-1, and 440-2 for the one or more second fuses 260-1 and 260-2 while leaving the transistors 410-1, 410-2, 420-1, and 420-2 for the one or more first fuses 250-1 and 250-2 turned off. The blow driver

450 then drives a high current through the one or more second fuses 260-1 and 260-2. The high current electro-migrates the metal in each of the one or more second fuses 260-1 and 260-2, which blows the one or more second fuses 260-1 and 260-2 and significantly increases the resistances of the one or more second fuses 260-1 and 260-2.

Figure 5:
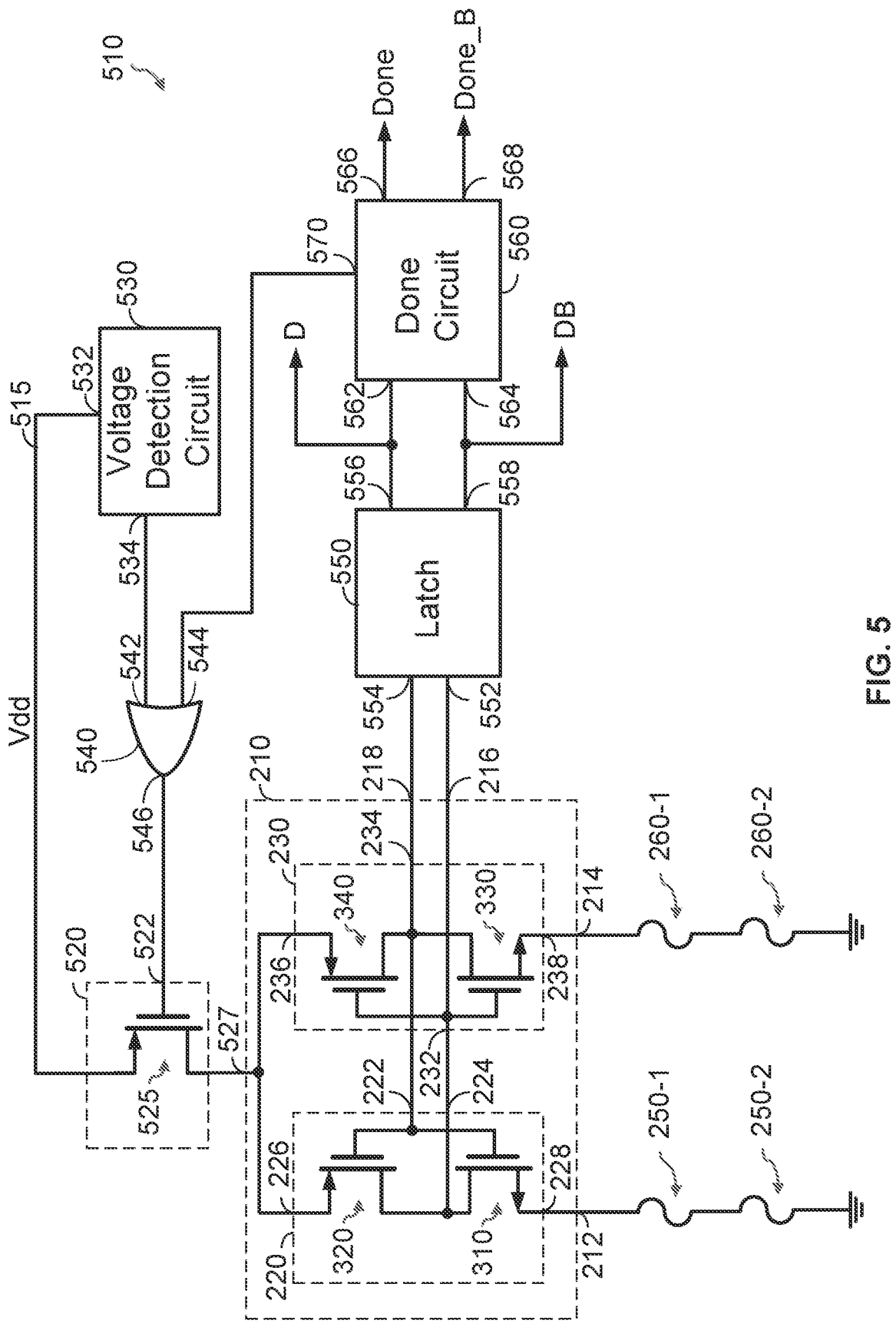
FIG. 5 shows an example of a read circuit according to certain aspects of the present disclosure.

FIG. 5 shows an example of a read circuit 510 including the read amplifier 210 according to certain aspects. As discussed further below, the read circuit 510 may be configured to autonomously turn on when the voltage Vdd on a bus 515 reaches a voltage threshold (e.g., during startup) to read the stored bit value. The bus 515 (also referred to as a supply rail) may correspond to the power bus 130 shown in FIG. 1, which receives power from the energy harvester 120.

In this example, the read circuit 510 includes a switch 520 coupled between the bus 515 and the read amplifier 210. In the example shown in FIG. 5, the switch 520 is coupled to a power terminal 527 of the read amplifier 210. The power terminal 527 is coupled to the first terminal 226 of the first inverter 220 (e.g., the source of the first PFET 320) and the first terminal 236 of the second inverter 230 (e.g., the source of the second PFET 340).

The switch 520 is used to selectively gate power to the read amplifier 210, as discussed further below. The switch 520 has a control input 522 for controlling the on/off state of the switch 520. As used herein, a "control input" of a switch is an input that controls whether the switch is turned on or turned off based on a signal (e.g., voltage) applied to the input. In the example shown in FIG. 5, the switch 520 is implemented with a PFET 525 in which the gate of the PFET 525 is coupled to the control input 522.

The read circuit 510 also includes a voltage detection circuit 530, an OR gate 540, a latch 550, and a done circuit 560. The voltage detection circuit 530 has an input 532 coupled to the bus 515, and an output 534 coupled to the control input 522 of the switch 520 through the OR gate 540. It is to be appreciated that the output 534 of the voltage detection circuit 530 may be coupled to the control input 522 without the OR gate 540 in some implementations.

The voltage detection circuit 530 is configured to detect the voltage Vdd on the bus 515 and compare the detected voltage with a voltage threshold. The voltage threshold may be the same as or different from the voltage threshold used by the voltage monitor 145 discussed above. If the detected voltage is below the voltage threshold, then the voltage detection circuit 530 turns off the switch 520. In this case, the voltage on the bus 515 may be too low for the read amplifier 210 to operate reliably. If the detected voltage is equal to greater than the voltage threshold, then the voltage detection circuit 530 may turn on the switch 520 to power the read amplifier 210. Thus, in this example, the voltage detection circuit 530 may turn on the switch 520 when the voltage on the bus 515 reaches the voltage threshold. The voltage threshold may be set to a voltage that is sufficient for the read amplifier 210 to reliably read the stored bit value.

For the example where the switch 520 includes the PFET 525, the voltage detection circuit 530 turns off the switch 520 by outputting a logic one to the gate of the PFET 525, and turns on the switch 520 by outputting a logic zero to the gate of the PFET 525. The logic one may correspond to the voltage Vdd, and the logic zero may correspond to ground potential.

The latch 550 has a first input 552 coupled to the first output 216 of the read amplifier 210, and a second input 554 coupled to the second output 218 of the read amplifier 210. The latch 550 also has a first output 556 and a second output 558. The latch 550 may be implemented with a set-reset (SR) latch or another type of latch.

When the switch 520 is turned on, the read amplifier 210 receives power from the bus 515 through the switch 520. This causes the read amplifier 210 to read the bit value stored by the one or more first fuses 250-1 and 250-2 and the one or more second fuses 260-1 and 260-2, as discussed above. The read amplifier 210 outputs the read bit value at the first output 216 and the complement of the read bit value at the second output 218. The latch 550 latches the read bit value and the complement of the read bit value, outputs the latched read bit value at the first output 556, and outputs the latched complement of the read bit value at the second output 558. The latched read bit value may be output at a first read output D of the read circuit 510, and the latched complement of the read bit value may be output at a second read output DB of the read circuit 510. For example, the first read output D and/or the second read output DB may be coupled to the voltage monitor 145 to provide the read bit value and/or the complement of the read bit value to the voltage monitor 145.

The done circuit 560 has a first input 562 coupled to the first output 556 of the latch 550, and a second input 564 coupled to the second output 558 of the latch 550. The done circuit 560 also has a first output 566, a second output 568, and a third output 570. The third output 570 may be coupled to the control input 522 of the switch 520 through the OR gate 540.

The done circuit 560 is configured to detect when the read operation of the read amplifier 210 is done. For example, the done circuit 560 may detect the read operation is done when one of the outputs 556 and 558 of the latch 550 is high (i.e., has a logic state of one). This is because the outputs 556 and 558 of the latch 550 are complementary after the read operation of the read amplifier 210 is done and the latch 550 latches the read bit value and the complement of the read bit value from the read amplifier 210. Since the outputs 556 and 558 of the latch 550 are complementary when the read operation is done, one of the outputs 556 and 558 is high when the read operation is done. This allows the done circuit 560 to detect the read operation is done by detecting when one of the outputs 556 and 558 is high.

When the done circuit 560 detects that the read operation is done, the done circuit 560 outputs a done signal at the first output 566 and outputs a complement of the done signal at the second output 568. The done signal may be high (e.g., logic one) to indicate that the read operation is done. The done signal may be output at a first done output Done of the read circuit 510, and the complement of the done signal may be output at a second done output Done_B of the read circuit 510.

When the done circuit 560 detects that the read operation is done, the done circuit 560 may also turn off the switch 520 to shut off power to the read amplifier 210, which reduces current consumption. After the power to the read amplifier 210 is shut off, the latch 550 may maintain the latched read bit value at the first read output D of the read circuit 510 and maintain the latched complement of the read bit value at the second read output DB of the read circuit 510. For the example where the switch 520 includes the PFET 525, the done circuit 560 may turn off the switch 520 by outputting a logic one to the gate of the PFET 525 through the OR gate 540.

In the example in FIG. 5, the output 534 of the voltage detection circuit 530 and the third output 570 of the done circuit 560 are coupled to the control input 522 of the switch 520 through the OR gate 540. In this example, the OR gate 540 has a first input 542 coupled to the output 534 of the voltage detection circuit 530, a second input 544 coupled to the third output 570 of the done circuit 560, and an output 546 coupled to the control input 522 of the switch 520. For the example where the switch 520 includes the PFET 525, the OR gate 540 turns off the switch 520 when at least one of the outputs 534 and 570 is high, and turns on the switch 520 when both of the outputs 534 and 570 are low. It is to be appreciated that the read circuit 510 is not limited to the OR gate 540, and that the output 534 of the voltage detection circuit 530 and the third output 570 of the done circuit 560 may be coupled to the control input 522 of the switch 520 through a different type of logic gate or another type of circuit. It is also to be appreciated that the OR gate 540 may be implemented with combinational logic configured to perform an OR operation according to certain aspects.

Figure 6:
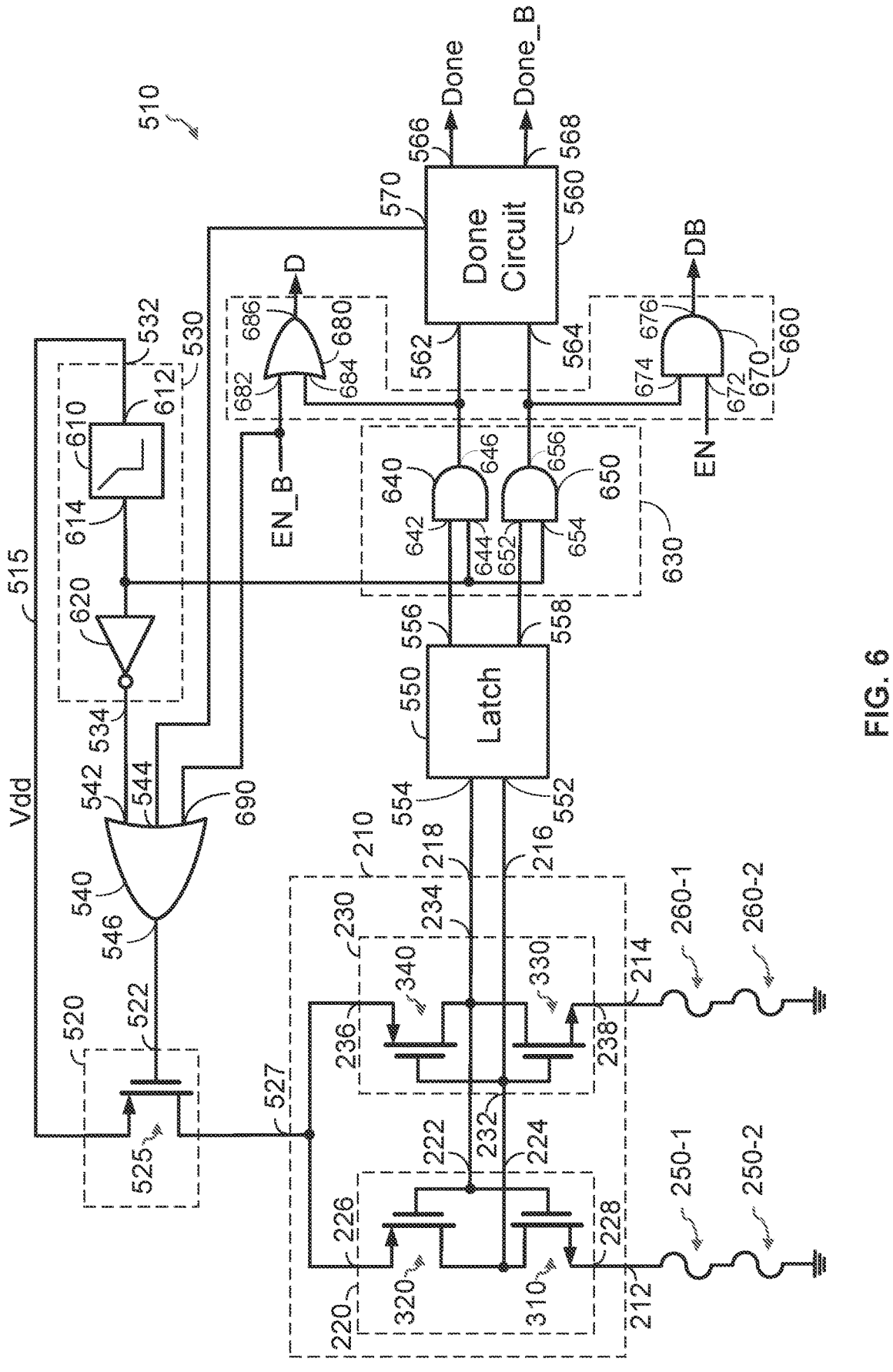
FIG. 6 shows an example of the read circuit of FIG. 6 further including a gating circuit and an enable circuit according to certain aspects of the present disclosure.

FIG. 6 shows an exemplary implementation of the voltage detection circuit 530 according to certain aspects. In this example, voltage detection circuit 530 includes a voltage detector 610 and an inverter 620. The voltage detector 610 has an input 612 coupled to the input 532 of the voltage detection circuit 530, and an output 614. The input of the inverter 620 is coupled to the output 614 of the voltage detector 610, and the output of the inverter 620 is coupled to the output 534 of the voltage detection circuit 530.

The voltage detector 610 is configured to sense the voltage at the input 612, output a logic zero at the output 614 if the sensed voltage is below the voltage threshold, and output a logic one if the sensed voltage is equal to or greater than the voltage threshold. In the example shown in FIG. 6, the input 612 of the voltage detector 610 is coupled to the bus 515, and therefore senses the voltage Vdd on the bus 515 is this example. The voltage detector 610 may be implemented, for example, with a voltage comparator configured to compare the sensed voltage with the voltage threshold, and output a logic one or a logic zero based on the comparison.

The inverter 620 inverts the output signal of the voltage detector 610 and outputs the inverse of the output signal to the control input 522 of the switch 520 through the OR gate 540. When the sensed voltage at the input 612 is below the voltage threshold, the voltage detector 610 outputs a logic zero. The inverter 620 inverts the logic zero into a logic one which turns off the switch 520 for the example where the switch 520 includes the PFET 525. When the sensed voltage at the input 612 is equal to or greater than the voltage threshold, the voltage detector 610 outputs a logic one. The inverter 620 inverts the logic one into a logic zero which turns on the switch 520 for the example where the switch 520 includes the PFET 525.

In the example shown in FIG. 6, the read circuit 510 also includes a gating circuit 630 and an enable circuit 660. The gating circuit 630 is coupled between the outputs 556 and 558 of the latch 550 and the inputs 562 and 564 of the done circuit 560. The gating circuit 630 is also coupled to the output 614 of the voltage detector 610. The enable circuit 660 is coupled between the gating circuit 630 and the read outputs D and DB. As discussed further below, the enable circuit 660 is configured to enable or disable the read outputs D and DB of the read circuit 510. When the enable circuit 660 enables the read outputs D and DB of the read circuit 510, the enable circuit 660 couples the gating circuit 630 to the read outputs D and DB.

The gating circuit 630 is configured to gate the output signals of the latch 550 (i.e., the signals at the outputs 556 and 558) when the voltage detector 610 detects that the sensed voltage at the input 612 is below the voltage threshold (e.g., the voltage detector 610 outputs a logic zero). The gating circuit 630 is configured to pass the output signals of the latch 550 to the done circuit 560 and the read outputs D and DB of the read circuit 510 when the voltage detector 610 detects that the sensed voltage at the input 612 is equal to or greater than the voltage threshold (e.g., the voltage detector 610 outputs a logic one). In other words, the gating circuit 630 un-gates the outputs 556 and 558 of the latch 550 when the sensed voltage is equal to or greater than the voltage threshold. Thus, in this example, the gating circuit 630 passes the output signals of the latch 550 to the read outputs D and DB of the read circuit 510 when the voltage Vdd on the bus 515 is equal to or greater than the voltage threshold. This helps ensure that a valid read bit and a valid complement of the read bit are output from the first read output D and the second read output DB, respectively.

In the example shown in FIG. 6, the gating circuit 630 includes a first AND gate 640 and a second AND gate 650. The first AND gate 640 has a first input 642 coupled to the first output 556 of the latch 550, a second 644 input coupled to the output 614 of the voltage detector 610, and an output 646 coupled to the first input 562 of the done circuit 560. The second AND gate 650 has a first input 652 coupled to the second output 558 of the latch 550, a second input 654 coupled to the output 614 of the voltage detector 610, and an output 656 coupled to the second input 564 of the done circuit 560. In this example, the first AND gate 640 and the second AND gate 650 gate the signals at the first output 556 and the second output 558, respectively, of the latch 550 when the output 614 of the voltage detector 610 is low (i.e., logic zero) indicating that the sensed voltage is below the voltage threshold. This first AND gate 640 and the second AND gate 650 pass the signals at the first output 556 and the second output 558, respectively, of the latch 550 when the output 614 of the voltage detector 610 is high (i.e., logic one) indicating that the sensed voltage is equal to or greater than the voltage threshold.

It is to be appreciated that the gating circuit 630 is not limited to the AND gates 640 and 650, and that the gating circuit 630 may be implemented with other types of logic gates in other implementations. It is also to be appreciated that each of the AND gates 640 and 650 may be implemented with combinational logic configured to perform an AND operation according to certain aspects.

The enable circuit 660 is configured to enable or disable the read circuit 510 based on an enable signal received at a first enable input EN of the read circuit 510 and a complement of the enable signal received at a second enable input EN_B of the read circuit 510. In this example, the enable circuit 660 may be configured to disable the read circuit 510 when the enable signal is logic zero and the complement of the enable signal is logic one, and enable the read circuit 510 when the enable signal is logic one and the complement of the enable signal is logic zero.

In the example shown in FIG. 6, the second enable input EN_B is coupled to the control input 522 of the switch 520 through the OR gate 540, which has a third input 690 coupled to the second enable input EN_B in this example. When the complement of the enable signal is logic one to disable the read circuit 510, the logic one is routed to the control input 522 of the switch 520 through the OR gate 540. The logic one keeps the switch 520 turned off for the example where the switch 520 includes the PFET 525. Thus, in this example, the switch 520 is turned off when the read circuit 510 is disabled, which prevents the read amplifier 210 from receiving power from the bus 515.

In the example shown in FIG. 6, the enable circuit 660 includes an AND gate 670 and an OR gate 680. The AND gate 670 has a first input 672 coupled to the first enable input EN, a second input 674 coupled to the output 656 of the AND gate 650, and an output 676 coupled to the second read output DB. The OR gate 680 has a first input 682 coupled to the second enable input EN_B, a second input 684 coupled to the output 646 of the AND gate 640, and an output 686 coupled to the first read output D. When the enable signal and the complement of the enable signal are logic one and logic zero, respectively, the OR gate 680 and the AND gate 670 pass the read bit value and the complement of the read bit value to the first read output D and the second read output DB, respectively.

It is to be appreciated that the enable circuit 660 is not limited to the AND gate 670 and the OR gate 680, and that the enable circuit 660 may be implemented with other types of logic gates in other implementations. It is also to be appreciated that AND gate 670 and the OR gate 680 may each be implemented with combinational logic.

Figure 7:
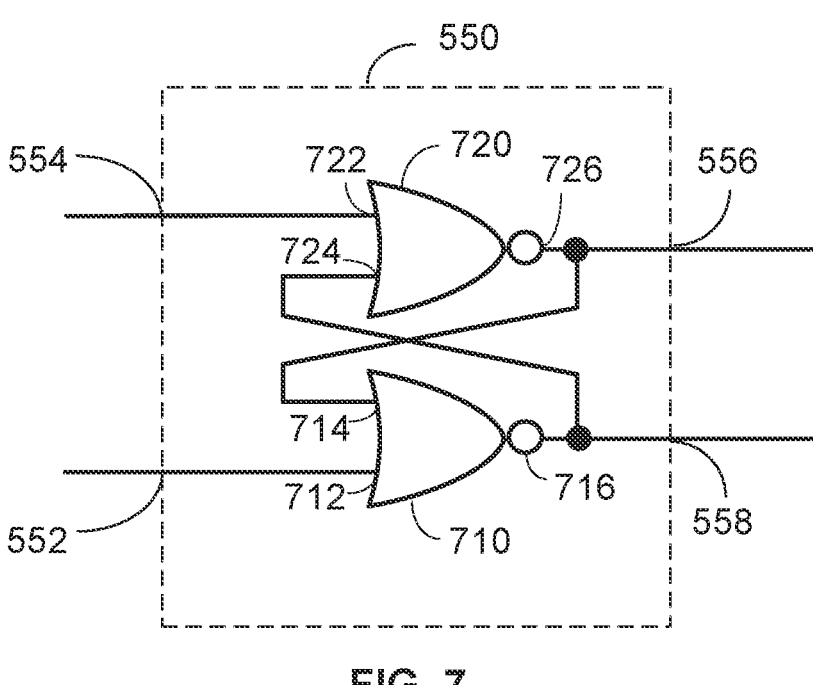
FIG. 7 shows an exemplary implementation of a latch according to certain aspects of the present disclosure.

FIG. 7 shows an exemplary implementation of the latch 550 according to certain aspects. In this example, the latch 550 is implemented with an S-R latch including a first NOR gate 710 and a second NOR gate 720. The first NOR gate 710 has a first input 712 coupled to the first input 552 of the latch 550, a second input 714, and an output 716 coupled to the second output 558 of the latch 550. The second NOR gate 720 has a first input 722 coupled to the second input 554 of the latch 550, a second input 724 coupled to the output 716 of the first NOR gate 710, and an output 726 coupled to the second input 714 of the first NOR gate 710 and the first output 556 of the latch 550. It is to be appreciated that the latch 550 is not limited to the exemplary implementation shown in FIG. 7. For example, the latch 550 may be implemented with NAND gates or other types of logic gates in other implementations.

Figure 8:
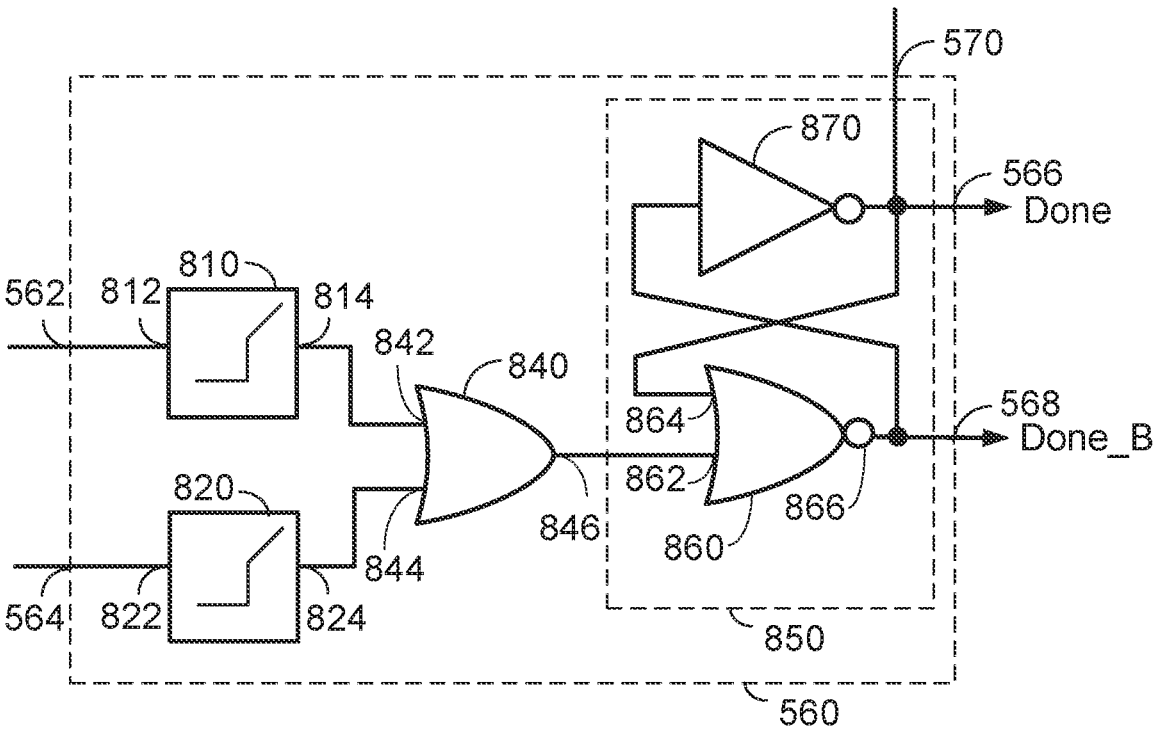
FIG. 8 shows an exemplary implementation of a done circuit according to certain aspects of the present disclosure.

FIG. 8 shows an exemplary implementation of the done circuit 560 according to certain aspects. In this example, the done circuit 560 includes a first voltage detector 810, a second voltage detector 820, an OR gate 840, and a latch 850. The first voltage detector 810 has an input 812 coupled to the first input 562 of the done circuit 560, and an output 814. The second voltage detector 820 has an input 822 coupled to the second input 564 of the done circuit 560, and an output 824. The OR gate 840 has a first input 842 coupled the output 814 of the first voltage detector 810, a second input 844 coupled the output 824 of the second voltage detector 820, and an output 846 coupled to the latch 850.

The first voltage detector 810 is configured to pass a logic one at the input 812 to the output 814 when the logic one is equal to or greater than a pass voltage threshold. The pass voltage threshold may be the same as or different from the voltage threshold of the voltage detector 610. The second voltage detector 820 is configured to pass a logic one at the input 822 to the output 824 when the logic one is equal to or greater than the pass voltage threshold. In this example, when the read amplifier 210 is done with a read operation, one of the first and second voltage detectors 810 and 820 receives a logic one at the respective input 812 and 822. Assuming the logic one is equal to or greater than the pass voltage threshold, the logic one is passed to the first input 842 or the second input 844 of the OR gate 840. This causes the OR gate 840 to output the logic one to the latch 850. The latch 850 latches the logic one, and outputs the latched logic one at the first output 566 of the done circuit 560 to provide the done signal, and outputs the complement of the logic one (i.e., logic zero) at the second output 568 of the done circuit

560 to provide the complement of the done signal. As discussed above, the done signal indicates that the read amplifier 210 is done with the read operation.

In the example shown in FIG. 8, the latch 850 includes a NOR gate 860 and an inverter 870. The NOR gate 860 has a first input 862 coupled to the output 846 of the OR gate 840, a second input 864 coupled to the output of the inverter 870, and an output 866 coupled to the second output 568 of the done circuit 560 and the input of the inverter 870. The output of the inverter 870 is coupled to the first output 566 of the done circuit 560.

In the example in FIG. 8, the done signal is used to turn off the switch 520. For the example where the switch 520 includes the PFET 525, the logic one of the done signal turns off the switch 520, shutting off power to the read amplifier 210.

As discussed above, the exemplary read circuit 510 may autonomously turn on the read amplifier 210 to read the bit value store at the read circuit 510 when the voltage Vdd on the bus 515 reaches a certain voltage (e.g., the voltage threshold of the voltage detection circuit 530).

In certain aspects, a read circuit may turn on to read the respective bit value when another read circuit is done with its read operation. As discussed further below, this feature allows multiple read circuits to be coupled together in a way that causes the read circuits to sequentially read their respective bits values without the need for an external clock signal.

Figure 9:
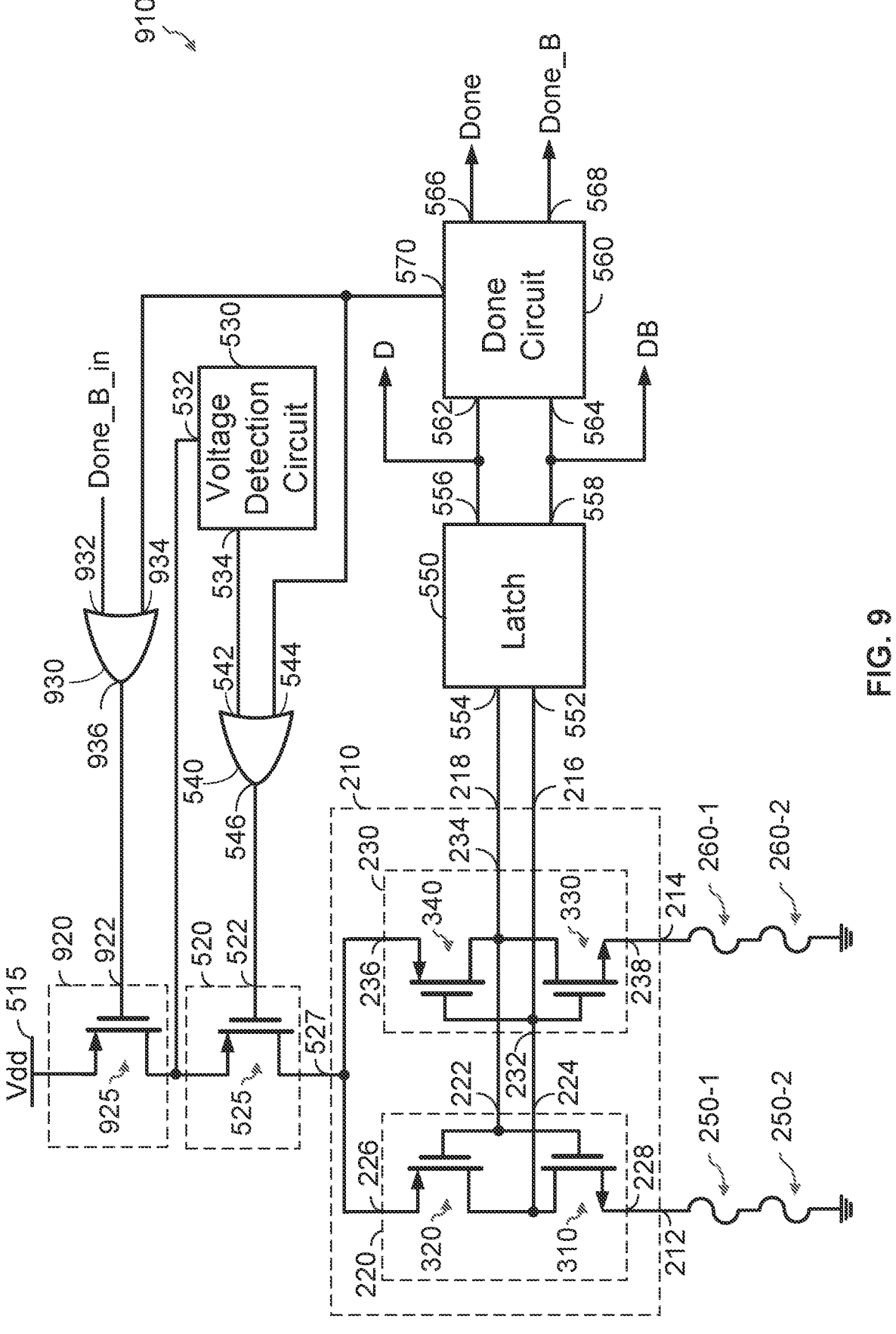
FIG. 9 shows another example of a read circuit according to certain aspects of the present disclosure.

FIG. 9 shows another example of a read circuit 910 according to certain aspects. As discussed further below, the read circuit 910 is configured to turn on and read its respective bit value when the done signal and/or the complement of the done signal from a previous read circuit (e.g., the read circuit 510 or another instance of the read circuit 910) indicates the previous read circuit is done with its read operation.

In this example, the read circuit 910 includes the switch 520, the voltage detection circuit 530, the read amplifier 210, the latch 550, the done circuit 560, and the OR gate 540 discussed above. The read circuit 910 also includes a second switch 920 coupled in series with the switch 520 between the bus 515 and the read amplifier 210. In the description below, the switch 520 is referred to as the first switch. In the example shown in FIG. 9, the second switch 920 includes a respective PFET 925. However, it is to be appreciated that the second switch 920 is not limited to this example. Also, in the example shown in FIG. 9, the input 532 of the voltage detection circuit 530 is coupled between the first switch 520 and the second switch 920.

In certain aspects, the second switch 920 is configured to turn on when a previous read circuit (e.g., the read circuit 510 or another instance of the read circuit 910) indicates that the read operation of the previous read circuit is done. In the example shown in FIG. 9, the control input 922 of the second switch 920 is coupled to a done input Done_B_in, which is coupled to the second done output Done_B of the previous read circuit to receive the complement of the done signal of the previous read circuit. In this example, the second switch 920 turns on when the complement of the done signal from the previous read circuit is low, indicating that the read operation of the previous read circuit is done. However, it is to be appreciated that the second switch 920 is not limited to this example. In another example, the second switch 920 may be configured to receive the done signal from the previous read circuit and turn on when the done signal from the previous read circuit is high. In both examples, the second switch 920 is configured to turn on when the previous read circuit outputs a signal indicating that the previous read circuit is done with its read operation.

When the second switch 920 turns on, the first switch 520 and the input 532 of the voltage detection circuit 530 are coupled to the bus 515 through the second switch 920. This allows the voltage detection circuit 530 to detect the voltage Vdd on the bus 515, and turn on the first switch 520 when the detected voltage is equal to or greater than the voltage threshold of the voltage detection circuit 530. This helps ensure that the voltage Vdd on the bus 515 is sufficient to perform a read operation. The bus 515 may be shared with other read circuits (e.g., the previous read circuit).

When the first switch 520 is turned on, the read amplifier 210 receives power from the bus 515 through the switches 520 and 920. This causes the read amplifier 210 to read the bit value stored by the respective one or more first fuses 250-1 and 250-2 and the respective one or more second fuses 260-1 and 260-2, as discussed above. The read amplifier 210 outputs the read bit value at the first output 216 and the complement of the read bit value at the second output 218. The latch 550 latches the read bit value and the complement of the read bit value, outputs the latched read bit value at the first output 556, and outputs the latched complement of the read bit value at the second output 558. The latched read bit value may be output at the first read output D of the read circuit 910, and the latched complement of the read bit value may be output at the second read output DB of the read circuit 910. The done circuit 560 detects that the read operation is done based on the outputs 556 and 558 of the latch, and outputs the done signal at the first done output Done and outputs the complement of the done signal at the second done output Done_B indicating that the read operation is done. For example, the done signal and/or the complement of the done signal may be coupled to a next read circuit (e.g., another instance of the read circuit 910) to trigger the next read circuit to read its respective bit value.

In certain aspects, the done circuit 560 may turn off both the first switch 520 and the second switch 920 when the done circuit 560 detects that the read operation is done. In this example, the third output 570 of the done circuit is coupled to the control input 522 of the first switch 520 through the OR gate 540, as discussed above. Also, in this example, the third output 570 is coupled to the control input 922 of the second switch 920 through a second OR gate 930. In this example, the done circuit 560 may turn off both switches 520 and 920 by outputting a logic one at the third output 570, in which the logic one passes through the OR gate 540 to turn off the first switch 520 and passes through the second OR gate 930 to turn off the second switch 920. In the example shown in FIG. 9, the second OR gate 930 has a first input 932 coupled to the done input Done_B_in, a second input 934 coupled to the third output 570 of the done circuit 560, and an output 936 coupled to the control input 922 of the second switch 920.

Figure 10:
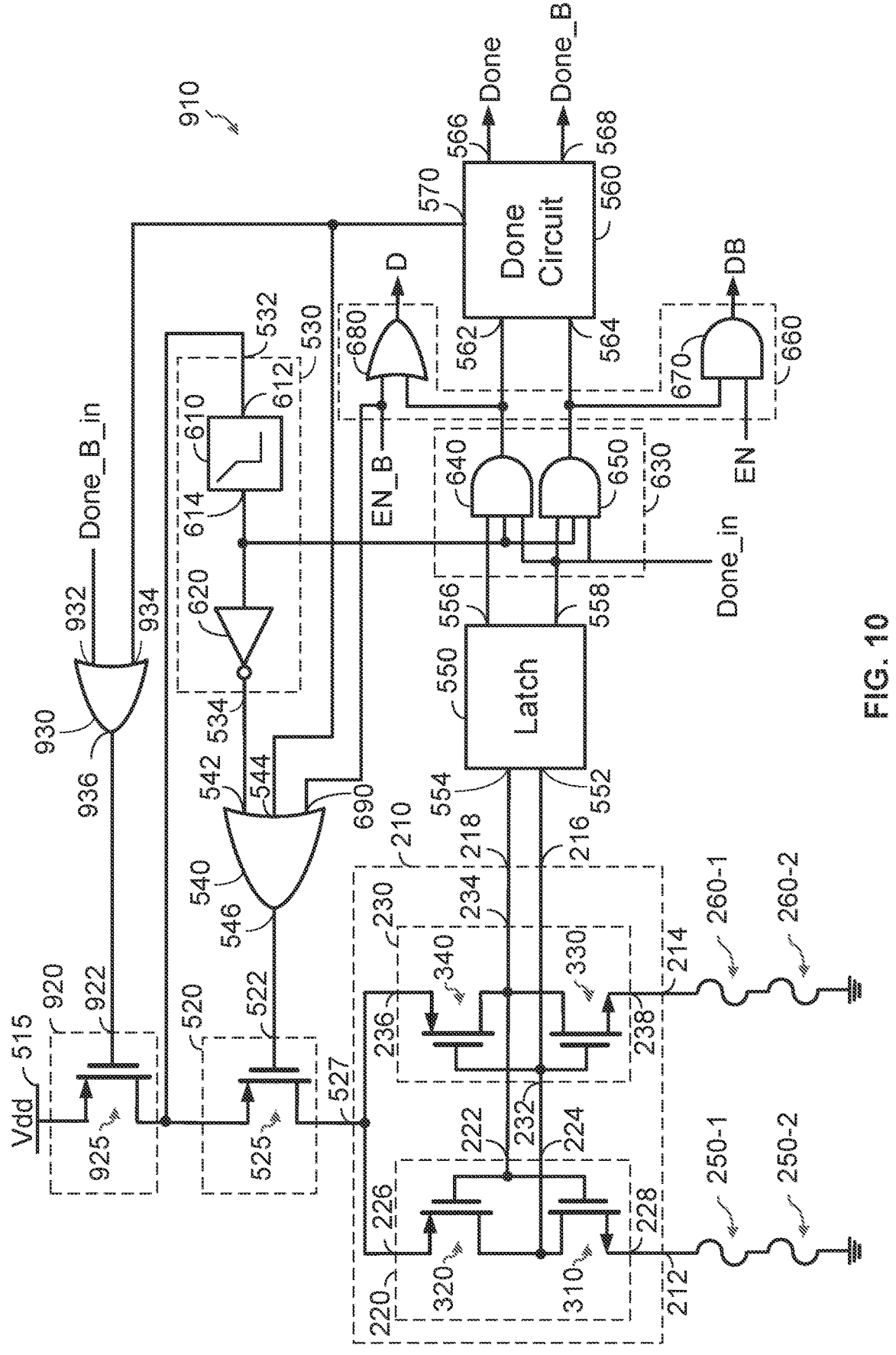
FIG. 10 shows an example of the read circuit of FIG. 9 further including a gating circuit and an enable circuit according to certain aspects of the present disclosure.

FIG. 10 shows an example in which the read circuit 910 also includes the gating circuit 630 and the enable circuit 660 discussed above. In this example, the gating circuit 630 includes the AND gates 640 and 650 in which each of the AND gates 640 and 650 has a third input coupled to a done input Done_in, which may be coupled to the first done output Done of the previous read circuit to receive the done signal of the previous read circuit. In this example, the gating circuit 630 is ungated when the voltage Vdd on the bus 515 is equal to or greater than the voltage threshold of the voltage detection circuit 530 and the done signal from the previous read circuit indicates that the read operation of the previous read circuit is done.

The latch 550 may be implemented with the example implementation shown in FIG. 7, and the done circuit 560 may be implemented with the exemplary implementation shown in FIG. 8. However, it is to be appreciated that the latch 550 and the done circuit 560 are not limited to these examples.

Figure 11:
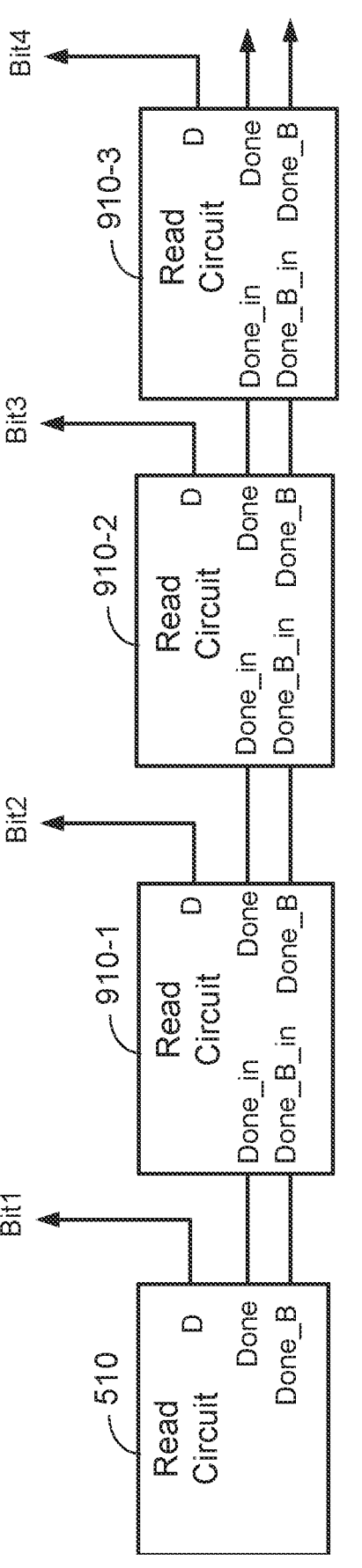
FIG. 11 shows an example of multiple read circuits coupled together according to certain aspects of the present disclosure.

FIG. 11 shows an example of multiple read circuits coupled together to read multiple bits. The multiple read circuits include the read circuit 510 and read circuits 910-1 to 910-3 where each of the read circuits 910-1 to 910-3 is a separated instance (i.e., copy) of the read circuit 910. The read circuit 510 and the read circuits 910-1 to 910-3 may share the bus 515.

In this example, the first done output Done and the second done output Done_B of the read circuit 510 are coupled to the done input Done_in and the done input Done_B_in of the read circuit 910-1, respectively. The first done output Done and the second done output Done_B of the read circuit 910-1 are coupled to the done input Done_in and the done input Done_B_in of the read circuit 910-2, respectively. The first done output Done and the second done output Done_B of the read circuit 910-2 are coupled to the done input Done_in and the done input Done_B_in of the read circuit 910-3, respectively. The first done output Done and the second done output Done_B of the read circuit 910-3 may be coupled to the done input Done_in and the done input Done_B_in of a next read circuit (not shown), respectively.

During operation, when the voltage vdd on the bus 515 reaches a certain voltage (e.g., the voltage threshold of the voltage detection circuit 530 in the read circuit 510), the read circuit 510 turns on and read its respective bit. When the read operation of the read circuit 510 is done, the read circuit 510 outputs its read bit (labeled "Bit1") and outputs the respective done signal and the complement of the respective done signal to the read circuit 910-1. This triggers the read circuit 910-1 to turn on and read its respective bit. When the read operation of the read circuit 910-1 is done, the read circuit 910-1 outputs its read bit (labeled "Bit2") and outputs the respective done signal and the complement of the respective done signal to the read circuit 910-2. This triggers the read circuit 910-2 to turn on and read its respective bit. When the read operation of the read circuit 910-2 is done, the read circuit 910-2 outputs its read bit (labeled "Bit3") and outputs the respective done signal and the complement of the respective done signal to the read circuit 910-3. This triggers the read circuit 910-3 to turn on and read its respective bit, and so forth.

Thus, in this example, the read circuit 510 and the read circuit 910-1 to 910-3 sequentially read and output their respective bits, in which each read circuit triggers the next read circuit to read its bit until all of the read circuits have been triggered. The read circuit 510 and the read circuits 910-1 to 910-3 are able to sequentially read and output their respective bit values without the need for an external clock signal to coordinate the read operations of the read circuit 510 and the read circuits 910-1 to 910-3. The removal of the clock signal reduces power consumption. Also, the sequential reading of the bits and the voltage detection circuit (e.g., respective voltage detection circuit 530) in each of the read circuit 510 and the read circuits 910-1 to 910-3 helps ensure that the voltage Vdd on the shared bus 515 is high enough for each read operation.

Figure 12:
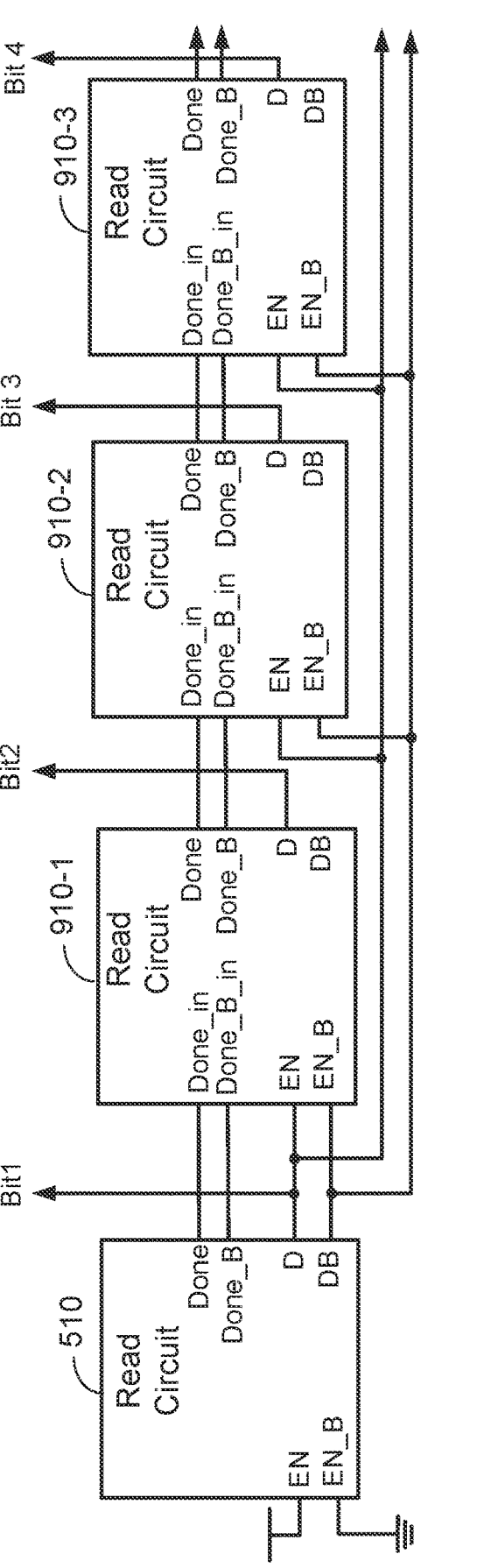
FIG. 12 shows another example of multiple read circuits coupled together according to certain aspects of the present disclosure.

FIG. 12 shows another example in which the read circuit 510 and read circuits 910-1 to 910-3 are coupled together. In this example, the first read output D and the second read output DB of the read circuit 510 are coupled to the first enable input EN and the second enable input EN_B, respectively, of each of the read circuits 910-1 to 910-3. As a result, the read circuits 910-1 to 910-3 are enabled or disabled based on the read bit of the read circuit 510. In this example, the read circuits 910-1 to 910-3 are enabled when the read bit of the read circuit 510 has a bit value of one, and disabled when the read bit of the read circuit 510 has a bit value of zero. Thus, in this example, only the bit of the read circuit 510 (labeled "Bit1") is read when the bit of the read circuit 510 has a bit value of zero.

As discussed above, the non-volatile memory 135 (which includes the read circuit 510 and the read circuits 910-1 to 910-3 in this example) may store the voltage threshold for the voltage monitor 145. In some implementations, the voltage threshold may be a function of the process corner of the circuit 150. For example, the voltage threshold may be higher for a slow-slow (SS) process corner and lower for a fast-fast (FF) process corner.

In this example, the voltage monitor 145 may be configured with a default voltage threshold for the SS process corner, and the bit of the read circuit 510 may indicate whether the process corner for the circuit 150 is an SS process corner. In this example, a bit value of zero indicates the SS process corner. Thus, when the process corner for the circuit 150 is an SS process corner, the read circuit 510 outputs a bit value of zero to the voltage monitor 145 indicating the SS process corner, and the voltage monitor 145 uses the default voltage threshold. In this case, the remaining read circuits 910-1 to 910-3 are disabled to reduce power. When the process corer for the circuit 150 is another process corner (e.g., FF process corner or typical-typical (TT) process corner), the read circuit 510 outputs a bit value of one and enables the remaining read circuits 910-1 to 910-3 to read and output their respective bits to the voltage monitor 145. The bits of the remaining read circuits 910-1 to 910-3 may indicate a voltage threshold for the voltage monitor 145.

FIG. 13 shows an example of a method 1300 for reading a bit stored in electronic fuses. The electronic fuses include one or more first fuses (e.g., the one or more first fuses 250-1 and 250-2) and one or more second fuses (e.g., the one or more second fuses 260-1 and 260-2).

At block 1310, a resistance difference between the one or more first fuses and the one or more second fuses is sensed using a read amplifier, the read amplifier including a first inverter and a second inverter that are cross coupled. For example, the read amplifier may correspond to the read amplifier 210, the first inverter may correspond to the first inverter 220, and the second inverter may correspond to the second inverter 230. In one example, each of the one or more first fuses is blown and each of the one or more second fuses is unblown. In another example, each of the one or more first fuses is unblown and each of the one or more second fuses is blown.

At block 1320, a logic value at an output of the first inverter is latched to obtain a first latched logic value. For example, the logic value at the output of the first inverter may be latched by the latch 550 (e.g., an S-R latch).

At block 1330, a logic value at an output of the second inverter is latched to obtain a second latched logic value, wherein the first latched logic value and the second latched logic value are complementary. For example, the logic value at the output of the second inverter may be latched by the latch 550 (e.g., an S-R latch).

At block 1340, at least one of the first latched logic value and the second latched logic value is output. For example, the at least one of the first latched logic value and the second latched logic value may be output from at least one of the first read output D and the second read output DB.

In certain aspects, the method 1300 may further include detecting one of the first latched logic value and the second latched logic value is a logic one, and outputting a done signal in response to detecting the one of the first latched logic value and the second latched logic value is the logic one. For example, the done circuit 560 may detect one of the first latched logic value and the second latched logic value is a logic one, and output the done signal.

In certain aspects, a switch (e.g., switch 520) is coupled between a bus (e.g., the bus 515) and the read amplifier. In these aspects, the method 1300 may further include detecting a voltage on the bus is above a threshold, and turning on the switch is response to detecting the voltage on the bus is above the threshold. For example, the voltage detection circuit 530 may detect the voltage on the bus and turn on the switch. The method 1300 may further include detecting one of the first latched logic value and the second latched logic value is a logic one, and turning off the switch in response to detecting the one of the first latched logic value and the second latched logic value is the logic one. For example, the done circuit 560 may detect one of the first latched logic value and the second latched logic value is a logic one, and turn off the switch in response to detecting the one of the first latched logic value and the second latched logic value is the logic one.

In certain aspects, a first switch (e.g., switch 520) and a second switch (e.g., switch 920) are coupled in series between a bus (e.g., bus 515) and the read amplifier. In these aspects, the method 1300 may further include receiving a signal indicating a read operation of a read circuit for another bit is done, turning on the second switch in response to receiving the signal, detecting a voltage between the first switch and the second switch is above a threshold, and turning on the first switch is response to detecting the voltage between the first switch and the second switch is above the threshold. For example, the voltage detection circuit 530 may detect the voltage between the first switch and the second switch and turn on the first switch. The method 1300 may further include detecting one of the first latched logic value and the second latched logic value is a logic one, and turning off the first switch and the second switch in response to detecting the one of the first latched logic value and the second latched logic value is the logic one. For example, the done circuit 560 may detect one of the first latched logic value and the second latched logic value is a logic one, and turn off the first switch and the second switch in response to detecting the one of the first latched logic value and the second latched logic value is the logic one.

Implementation examples are described in the following numbered clauses:

1. A system, comprising:
    a read amplifier having a first input, a second input, a first output, and a second output, the read amplifier comprising:
    a first inverter having an input and an output, wherein the output of the first inverter is coupled to the first output of the read amplifier; and
    a second inverter having an input and an output, wherein the output of the second inverter is coupled to the second output of the read amplifier and the input of the first inverter, and the input of the second inverter is coupled to the output of the first inverter; and
    one or more first fuses coupled to the first input of the read amplifier; and one or more second fuses coupled to the second input of the read amplifier.

2. The system of clause 1, wherein each of the one or more first fuses is blown and each of the one or more second fuses is unblown.

3. The system of clause 1, wherein each of the one or more first fuses is unblown and each of the one or more second fuses is blown.

4. The system of any one of clauses 1 to 3, wherein the one or more first fuses are coupled in series between the first input of the read amplifier a ground, and the one or more second fuses are coupled in series between the second input of the read amplifier and the ground.

5. The system of any one of clauses 1 to 4, wherein the first inverter comprises:
    a first n-type field effect transistor (NFET), wherein a source of the first NFET is coupled to the first input of the read amplifier, a drain of the first NFET is coupled to the output of the first inverter, and a gate of the first NFET is coupled to the input of the first inverter; and
    a first p-type field effect transistor (PFET), wherein a source of the first PFET is coupled to a power terminal of the read amplifier, a drain of the first PFET is coupled to the output of the first inverter, and a gate of the first PFET is coupled to the input of the first inverter.

6. The system of clause 5, wherein the second inverter comprises:
    a second NFET, wherein a source of the second NFET is coupled to the second input of the read amplifier, a drain of the second NFET is coupled to the output of the second inverter, and a gate of the second NFET is coupled to the input of the second inverter; and
    a second PFET, wherein a source of the second PFET is coupled to the power terminal of the read amplifier, a drain of the second PFET is coupled to the output of the second inverter, and a gate of the second PFET is coupled to the input of the second inverter.

7. The system of any one of clauses 1 to 6, further comprising:
    a switch coupled between a bus and the read amplifier; and
    a voltage detection circuit having an input and an output, wherein the input of the voltage detection circuit is coupled to the bus, and the output of the voltage detection circuit is coupled to a control input of the switch.

8. The system of clause 7, wherein the voltage detection circuit is configured to:
    detect a voltage at the input of the voltage detection circuit;
    turn off the switch if the detected voltage is less than a voltage threshold; and
    turn on the switch if the detected voltage is greater than the voltage threshold.

9. The system of clause 7 or 8, further comprising an energy harvester coupled to the bus.

10. The system of any one of clauses 7 to 9, further comprising a latch having a first input, a second input, a first output, and a second output, wherein the first input of the latch is coupled to the first output of the read amplifier, and the second input of the latch is coupled to the second output of the read amplifier.

11. The system of clause 10, wherein the latch comprises a set-reset (S-R) latch.

12. The system of clause 10 or 11, further comprising a done circuit coupled to the first output of the latch and the second output of the latch, wherein the done circuit is configured to:

detect one of the first output of the latch and the second output of the latch has a logic state of one; and output a done signal when the done circuit detects the one of the first output of the latch and the second output of the latch has the logic state of one.

13. The system of clause 12, wherein the done circuit is configured to turn off the switch when the done circuit detects the one of the first output of the latch and the second output of the latch has the logic state of one.

14. The system of any one of clauses 10 to 13, further comprising a gating circuit, wherein the gating circuit is coupled between the first output of the latch and a first read output, and the gating circuit is coupled between the second output of the latch and a second read output.

15. The system of clause 14, wherein the voltage detection circuit is configured to:

detect a voltage at the input of the voltage detection circuit;

cause the gating circuit to gate the first output of the latch and the second output of the latch if the detected voltage is less than a voltage threshold; and cause the gating circuit to un-gate the first output of the latch and the second output of the latch if the detected voltage is greater than the voltage threshold.

16. The system of clause 15, wherein the voltage detection circuit is configured to:

turn off the switch if the detected voltage is less than a voltage threshold; and turn on the switch if the detected voltage is greater than the voltage threshold.

17. The system of any one of clauses 1 to 6, further comprising:

a first switch;

a second switch, wherein the first switch and the second switch are coupled in series between a bus and the read amplifier; and a voltage detection circuit having an input and an output, wherein the input of the voltage detection circuit is coupled between the first switch and the second switch, and the output of the voltage detection circuit is coupled to a control input of the first switch.

18. The system of clause 17, wherein a control input of the second switch is configured to receive a signal from a read circuit indicating the read circuit is done with a read operation, and the second switch is configured to turn on in response to the signal from the read circuit.

19. The system of clause 17 or 18, wherein the voltage detection circuit is configured to:

detect a voltage at the input of the voltage detection circuit;

turn off the first switch if the detected voltage is less than a voltage threshold; and turn on the first switch if the detected voltage is greater than the voltage threshold.

20. The system of any one of clauses 1 to 19, wherein:

the first inverter has a first terminal and a second terminal;

the second inverter has a first terminal and a second terminal;

the first terminal of the first inverter and the first terminal of the second inverter are coupled to a power terminal of the read amplifier;

the second terminal of the first inverter is coupled to the first input of the read amplifier; and the second terminal of the second inverter is coupled to the second input of the read amplifier.

21. The system of clause 20, further comprising:

a switch coupled between a bus and the power terminal of the read amplifier; and a voltage detection circuit having an input and an output, wherein the input of the voltage detection circuit is coupled to the bus, and the output of the voltage detection circuit is coupled to a control input of the switch.

22. The system of clause 21, wherein the voltage detection circuit is configured to:

detect a voltage at the input of the voltage detection circuit;

turn off the switch if the detected voltage is less than a voltage threshold; and turn on the switch if the detected voltage is greater than the voltage threshold.

23. A method for reading a bit stored in electronic fuses, the electronic fuses comprising one or more first fuses and one or more second fuses, the method comprising:

sensing a resistance difference between the one or more first fuses and the one or more second fuses using a read amplifier, the read amplifier including a first inverter and a second inverter that are cross coupled;

latching a logic value at an output of the first inverter to obtain a first latched logic value;

latching a logic value at an output of the second inverter to obtain a second latched logic value, wherein the first latched logic value and the second latched logic value are complementary; and outputting at least one of the first latched logic value and the second latched logic value.

24. The method of clause 23, further comprising:

detecting one of the first latched logic value and the second latched logic value is a logic one; and outputting a done signal in response to detecting the one of the first latched logic value and the second latched logic value is the logic one.

25. The method of clause 24, further comprising outputting the done signal to a read circuit configured to read another bit.

26. The method of any one of clauses 23 to 25, wherein a switch is coupled between a bus and the read amplifier, and the method further comprising:

detecting a voltage on the bus is above a threshold; and turning on the switch is response to detecting the voltage on the bus is above the threshold.

27. The method of clause 26, further comprising:

detecting one of the first latched logic value and the second latched logic value is a logic one; and turning off the switch in response to detecting the one of the first latched logic value and the second latched logic value is the logic one.

28. The method of any one of clauses 23 to 25, wherein a first switch and a second switch are coupled in series between a bus and the read amplifier, and the method further comprises:

receiving a signal indicating a read operation of a read circuit for another bit is done;

turning on the second switch in response to receiving the signal;

detecting a voltage between the first switch and the second switch is above a threshold; and turning on the first switch is response to detecting the voltage between the first switch and the second switch is above the threshold.

29. The method of clause 28, further comprising:

detecting one of the first latched logic value and the second latched logic value is a logic one; and turning off the first switch and the second switch in response to detecting the one of the first latched logic value and the second latched logic value is the logic one.

30. The method of any one of clauses 23 to 29, wherein each of the one or more first fuses is blown and each of the one or more second fuses is unblown.

31. The method of any one of clauses 23 to 29, wherein each of the one or more first fuses is unblown and each of the one or more second fuses is blown.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:

a read amplifier having a first input, a second input, a first output, and a second output, the read amplifier comprising:

a first inverter having an input and an output, wherein the output of the first inverter is coupled to the first output of the read amplifier; and a second inverter having an input and an output, wherein the output of the second inverter is coupled to the second output of the read amplifier and the input of the first inverter, and the input of the second inverter is coupled to the output of the first inverter;

one or more first fuses coupled to the first input of the read amplifier;

one or more second fuses coupled to the second input of the read amplifier;

a switch coupled between a supply rail and the read amplifier; and a voltage detection circuit having an input and an output, wherein the input of the voltage detection circuit is coupled to the supply rail, and the output of the voltage detection circuit is coupled to a control input of the switch.

2. The system of claim 1, wherein each of the one or more first fuses is blown and each of the one or more second fuses is unblown.

3. The system of claim 1, wherein each of the one or more first fuses is unblown and each of the one or more second fuses is blown.

4. The system of claim 1, wherein the first inverter comprises:

a first n-type field effect transistor (NFET), wherein a source of the first NFET is coupled to the first input of the read amplifier, a drain of the first NFET is coupled to the output of the first inverter, and a gate of the first NFET is coupled to the input of the first inverter; and a first p-type field effect transistor (PFET), wherein the switch is coupled between the supply rail and a source of the first PFET, a drain of the first PFET is coupled to the output of the first inverter, and a gate of the first PFET is coupled to the input of the first inverter.

5. The system of claim 4, wherein the second inverter comprises:

a second NFET, wherein a source of the second NFET is coupled to the second input of the read amplifier, a drain of the second NFET is coupled to the output of the second inverter, and a gate of the second NFET is coupled to the input of the second inverter; and a second PFET, wherein the switch is coupled between the supply rail and a source of the second PFET, a drain of the second PFET is coupled to the output of the second inverter, and a gate of the second PFET is coupled to the input of the second inverter.

6. The system of claim 1, wherein the voltage detection circuit is configured to:

detect a voltage at the input of the voltage detection circuit;

turn off the switch if the detected voltage is less than a voltage threshold; and turn on the switch if the detected voltage is greater than the voltage threshold.

7. The system of claim 1, further comprising a latch having a first input, a second input, a first output, and a second output, wherein the first input of the latch is coupled to the first output of the read amplifier, and the second input of the latch is coupled to the second output of the read amplifier.

8. The system of claim 7, further comprising a done circuit coupled to the first output of the latch and the second output of the latch, wherein the done circuit is configured to:

detect one of the first output of the latch and the second output of the latch has a logic state of one; and output a done signal when the done circuit detects the one of the first output of the latch and the second output of the latch has the logic state of one.

9. The system of claim 8, wherein the done circuit is configured to turn off the switch when the done circuit detects the one of the first output of the latch and the second output of the latch has the logic state of one.

10. A system, comprising:

a read amplifier having a first input, a second input, a first output, and a second output, the read amplifier comprising:

a first inverter having an input and an output, wherein the output of the first inverter is coupled to the first output of the read amplifier; and a second inverter having an input and an output, wherein the output of the second inverter is coupled to the second output of the read amplifier and the input of the first inverter, and the input of the second inverter is coupled to the output of the first inverter;

one or more first fuses coupled to the first input of the read amplifier;

one or more second fuses coupled to the second input of the read amplifier;

a first switch;

a second switch, wherein the first switch and the second switch are coupled in series between a bus and the read amplifier; and a voltage detection circuit having an input and an output, wherein the input of the voltage detection circuit is coupled between the first switch and the second switch, and the output of the voltage detection circuit is coupled to a control input of the first switch.

11. The system of claim 10, wherein a control input of the second switch is configured to receive a signal from a read circuit indicating the read circuit is done with a read operation, and the second switch is configured to turn on in response to the signal from the read circuit.

12. The system of claim 11, wherein the voltage detection circuit is configured to:

detect a voltage at the input of the voltage detection circuit;

turn off the first switch if the detected voltage is less than a voltage threshold; and turn on the first switch if the detected voltage is greater than the voltage threshold.

13. The system of claim 10, wherein the bus comprises a supply rail.

14. A method for reading a bit stored in electronic fuses, the electronic fuses comprising one or more first fuses and one or more second fuses, the method comprising:

detecting a voltage between a first switch and a second switch is above a threshold, wherein the first switch and the second switch are coupled in series between a bus and a read amplifier;

turning on the first switch is response to detecting the voltage between the first switch and the second switch is above the threshold;

receiving a signal indicating a read operation of a read circuit for another bit is done;

turning on the second switch in response to receiving the signal;

sensing a resistance difference between the one or more first fuses and the one or more second fuses using the read amplifier, the read amplifier including a first inverter and a second inverter that are cross coupled;

latching a logic value at an output of the first inverter to obtain a first latched logic value;

latching a logic value at an output of the second inverter to obtain a second latched logic value, wherein the first latched logic value and the second latched logic value are complementary; and outputting at least one of the first latched logic value and the second latched logic value.

15. The method of claim 14, further comprising:

detecting one of the first latched logic value and the second latched logic value is a logic one; and outputting a done signal in response to detecting the one of the first latched logic value and the second latched logic value is the logic one.

16. The method of claim 14, wherein the bus comprises a supply rail.

17. A method for reading a bit stored in electronic fuses, the electronic fuses comprising one or more first fuses and one or more second fuses, the method comprising:

detecting a voltage on a supply rail is above a threshold;

turning on a switch is response to detecting the voltage on the supply rail is above the threshold, wherein the switch is coupled between the supply rail and a read amplifier;

sensing a resistance difference between the one or more first fuses and the one or more second fuses using the read amplifier, the read amplifier including a first inverter and a second inverter that are cross coupled;

latching a logic value at an output of the first inverter to obtain a first latched logic value;

latching a logic value at an output of the second inverter to obtain a second latched logic value, wherein the first latched logic value and the second latched logic value are complementary; and outputting at least one of the first latched logic value and the second latched logic value.

* * * * *